(12) United States Patent
Arai et al.

(10) Patent No.: US 7,531,767 B2
(45) Date of Patent: May 12, 2009

(54) METHOD AND APPARATUS FOR LASER PERFORATING PRINTED CIRCUIT BOARD

(75) Inventors: Kunio Arai, Ebina (JP); Hiroyuki Sugawara, Hitachinaka (JP); Hiroaki Ashizawa, Ebina (JP); Hiromi Nishiyawa, Ebina (JP)

(73) Assignee: Hitachi Via Mechanics, Ltd., Ebina-shi (JP)

( * ) Notice: Subject to any disclaimer, the term of this patent is extended or adjusted under 35 U.S.C. 154(b) by 252 days.

(21) Appl. No.: 11/365,657

(22) Filed: Mar. 2, 2006

(65) Prior Publication Data

US 2006/0211158 A1 Sep. 21, 2006

(30) Foreign Application Priority Data

Mar. 4, 2005 (JP) ............................. 2005-061322
Jul. 25, 2005 (JP) ............................. 2005-213608

(51) Int. Cl.
  *B23K 26/38* (2006.01)
  *G06F 19/00* (2006.01)

(52) U.S. Cl. ............................. 219/121.7; 219/121.61; 219/121.71; 700/166

(58) Field of Classification Search ............. 219/121.7, 219/121.71, 121.83, 121.61, 121.62; 700/166
  See application file for complete search history.

(56) References Cited

U.S. PATENT DOCUMENTS 4,504,727 A * 3/1985 Melcher et al. .......... 219/121.7

| | | | |
|---|---|---|---|
| 6,433,301 B1 * | 8/2002 | Dunsky et al. | 219/121.7 |
| 6,441,337 B1 * | 8/2002 | Isaji et al. | 219/121.83 |
| 6,713,719 B1 * | 3/2004 | De Steur et al. | 219/121.71 |
| 7,244,906 B2 * | 7/2007 | Jordens et al. | 219/121.71 |
| 2001/0045419 A1 * | 11/2001 | Dunsky et al. | 219/121.76 |
| 2004/0019403 A1 * | 1/2004 | Liu et al. | 700/166 |
| 2004/0019404 A1 * | 1/2004 | Cheng et al. | 700/166 |
| 2004/0164057 A1 * | 8/2004 | Edme et al. | 219/121.7 |
| 2005/0247894 A1 * | 11/2005 | Watkins et al. | 250/559.13 |

FOREIGN PATENT DOCUMENTS

GB 2313079 A * 11/1997

(Continued)

*Primary Examiner*—Geoffrey S Evans
(74) *Attorney, Agent, or Firm*—Crowell & Moring LLP

(57) ABSTRACT

A method and an apparatus for perforating a printed circuit board are provided so that the processing efficiency and the board densification can be improved. In test processing, a conductor layer $50i$ is irradiated with a pulsed laser beam $4a$ whose energy density is set at a value high enough to process the conductor layer $50i$ while emission $23a$ from a processed portion is monitored. Thus, the number of pulses of irradiation required for processing a window in the conductor layer $50i$ is obtained. An insulating layer $51i$ is irradiated with a pulsed laser beam $5a$ whose energy density is set at a value high enough to process the insulating layer $51i$ but low enough not to process a conductor layer $50i+1$ under the insulating layer $51i$. Thus, the number of pulses of irradiation required for processing a window in the insulating layer $51i$ is obtained. The conductor layer $50i$ is irradiated with the laser beam $4a$ the obtained number of pulses of irradiation, and the insulating layer $51i$ is irradiated with the laser beam $5a$ the obtained number of pulses of irradiation. Thus, a hole is processed in the printed circuit board.

18 Claims, 13 Drawing Sheets

FOREIGN PATENT DOCUMENTS

| | | | | |
|---|---|---|---|---|
| JP | 59-27791 A | * | 2/1984 | |
| JP | 10-85976 A | | 4/1998 | |
| JP | 10-508798 A | | 9/1998 | |
| JP | 2001-102720 A | | 4/2001 | |
| JP | 2001-102720 A | * | 4/2001 | |
| JP | 2003-204137 A | * | 7/2003 | |
| JP | 2003-347747 A | * | 12/2003 | |
| JP | 2005-34878 A | * | 2/2005 | |
| WO | WO-86-2301 A1 | * | 4/1986 | |

* cited by examiner

METHOD AND APPARATUS FOR LASER PERFORATING PRINTED CIRCUIT BOARD

FIELD OF THE INVENTION

The present invention relates to a printed circuit board perforating method and apparatus for perforating a printed circuit board with a pulsed laser beam.

DESCRIPTION OF THE BACKGROUND ART

Consider that a printed circuit board having $n$ conductor layers and $n$ or $(n-1)$ insulating layers laminated alternately so that the first layer from the surface of the printed circuit board is a conductor layer is perforated with a pulsed laser beam from a UV laser (hereinafter referred to as "laser beam" simply) in the background art. In this case, when the diameter of a hole to be processed is not smaller than 50 μm, the printed circuit board is irradiated a required number of times with top-hat beam pulses having a diameter substantially equal to the entrance diameter of the hole and having an energy distribution substantially uniform in a plane perpendicular to the optical axis of the beam or Gaussian beam pulses having an energy distribution like a Gaussian curve in a plane perpendicular to the optical axis of the beam (hereinafter referred to as "punching method"). Alternatively, the printed circuit board is irradiated with a top-hat beam or a Gaussian beam whose diameter is smaller than the entrance diameter of the hole and not larger than 50 μm by positioning the top-hat beam or the Gaussian beam at locations, for example, along a circumferential path, and the irradiation is repeated along some other circumferential paths (hereinafter referred to as "trepanning method").

An optical scanner and a focusing lens are used to position the laser beam to a portion to be processed. A scan area defined by the size of the focusing lens is smaller than the printed circuit board. Therefore, when processing in the scan area is finished, the printed circuit board is moved to a next scan area horizontally relatively to the focusing lens so as to perform processing in the next scan area.

For example, JP-T-10-508798 (PCT/US95/08473) discloses a technique for perforating a material made of metal, insulator, etc. using ultraviolet light.

As an apparatus for performing laser processing while monitoring the condition of the processing, JP-A-10-85976 or JP-A-2001-102720 discloses a laser processing apparatus in which a beam splitter such as a polarizing beam splitter or a dichroic mirror is inserted into an optical path of a laser beam immediately after a laser oscillator or immediately in front of a work so as to deflect light reflected or emitted by the work from the optical path of the laser beam and sense the deflected light, or a laser processing apparatus in which a sensor is placed out of a laser optical path and near a work so as to sense light diffused or emitted by the work.

However, there is a large difference between a threshold value of decomposition energy of a conductor layer and a threshold value of decomposition energy of resin forming an insulating layer. Due to this difference, when one and the same portion is continuously irradiated with a pulsed laser beam so as to make a hole in a printed circuit board whose surface layer is a conductor layer, the diameter of the hole formed in an insulating layer under the conductor layer becomes larger than the diameter of the hole formed in the conductor layer. Thus, the conductor layer may overhang the hole formed in the insulating layer, or the hole formed in the insulating layer has a barrel-like shape such that the intermediate portion of the hole has a larger diameter than the entrance diameter.

When high-speed electroplating or filled plating (a plating method for filling a hole withgrowing a metal layer from the hole bottom) is performed on the hole such that the conductor layer overhangs the hole formed in the insulating layer, or the hole formed in the insulating layer has a barrel-like shape, the plating is concentrated in the hole entrance of the conductor layer. Thus, hollow portions (voids) are apt to occur in the plated layer. It is therefore impossible to shorten the plating time, and the processing efficiency cannot be improved.

Assume that processing is performed with energy density suitable to the conductor layer. In this case, when there is a variation in the thickness of the insulating layer, the surface of the conduct or layer at the hole bottom may be damaged. Further, the conductor layer at the hole bottom may be pierced.

When the insulating layer is made of a so-called glass-containing base material which contains glass fibers, glass fibers may project largely inside a hole formed by selectively removing the resin of the hole side wall. A slight gap may be formed between the hole and a hole adjacent thereto because a larger quantity of resin than necessary is removed. Thus, plating may lead to electric connection between the adjacent holes. For this reason, the hole-to-hole pitch cannot be narrowed and so-called board densification contributing to reduction of the printed circuit board size cannot be achieved.

SUMMARY OF THE INVENTION

In order to solve the foregoing problems belonging to the background art, an object of the present invention is to provide a printed circuit board perforating method aimed at improvement in the processing efficiency and densification of the board.

Another object of the present invention is to provide a printed circuit board perforating apparatus using a laser and suitable to the printed circuit board perforating method aimed at improvement in the processing efficiency and densification of the board, by which apparatus, problems not taken into consideration in the background-art laser processing apparatus, such as the influence of reflection inside the optical components or deformation of the shape of a beam occurring when the beam being converged by a lens penetrates an obliquely disposed parallel plate can be reduced.

In order to attain the foregoing object, a first constitution of the present invention is a method for perforating a printed circuit board having conductor layers and insulating layers laminated alternately, the method including the steps of: irradiating a conductor layer with a pulsed laser beam whose energy density is set at a value enough to process the conductor layer, while monitoring emission from the processed portion; obtaining the number of pulses of irradiation required for processing a window in the conductor layer; and processing a window in another place of the conductor layer by the obtained number of pulses of irradiation.

A second constitution of the present invention is a method for perforating a printed circuit board having $n$ conductor layers and $n$ or $(n-1)$ insulating layers laminated alternately, the first layer from the surface of the printed circuit board is a conductor layer, the method including the steps of: irradiating the first conductor layer a plurality of pulses with a pulsed laser beam whose diameter is equal to a designated hole entrance diameter and whose energy density is high enough to remove the first conductor layer, so as to remove the first conductor layer; irradiating the first insulating layer under the first conductor layer a plurality of pulses with a pulsed laser beam whose diameter is larger than the diameter of the laser beam processing the first conductor layer and whose energy density is high enough to remove the first insulating layer but low enough not to remove the first conductor layer, so as to remove the first insulating layer; irradiating the i-th (i is an integer from 2 to n) conductor layer a plurality of pulses with a pulsed laser beam whose diameter is smaller than the diameter of the laser beam processing the (i−1)th conductor layer and whose energy density is high enough to remove the i-th conductor layer, so as to remove the i-th conductor layer; and irradiating the i-th insulating layer under the i-th conductor layer a plurality of pulses with a pulsed laser beam whose energy density is equal to that of the laser beam processing the first insulating layer, so as to remove the i-th insulating layer; wherein the diameter of a hole formed in the first conductor layer is kept thus.

A third constitution of the present invention is a printed circuit board perforating apparatus in which a pulsed laser beam output from a laser oscillator is introduced through an optical system to a printed circuit board having conductor layers and insulating layers laminated alternately, so that a hole is processed in a to-be-processed portion of the printed circuit board, the printed circuit board perforating apparatus including: a sensor for monitoring emission from the processed portion; a comparison means for comparing an output of the sensor with a predetermined threshold value; a counter for counting the number of pulses of irradiation with the laser beam with which the processed portion is irradiated till the comparison means operates; and a storage unit for storing the number of pulses of irradiation counted by the counter; wherein the numbers of pulses of irradiation stored by test processing are used as the numbers of pulses of irradiation for processing the conductor layers and the insulating layers respectively.

A fourth constitution of the present invention is a laser processing apparatus for irradiating a work with a laser beam so as to process the work with the laser beam, having a laser oscillator for oscillating a laser beam, a beam scan optical system including a scanner and a processing lens for positioning the laser beam emitted from the laser oscillator, on the work, and a quarter wave plate disposed between the processing lens and the work and for polarizing light reflected by the work.

In this case, it is preferable that the beam scan optical system includes at least one steerable mirror, and a sensing means for receiving light running off the steerable mirror and reflected by the work is disposed on the opposite side to the work with respect to the steerable mirror.

It is also preferable that a beam sensing means having an opening larger than the laser beam emitted from the laser oscillator is disposed between the beam scan optical system and the laser oscillator and substantially coaxially with an optical axis of the laser beam.

A fifth constitution of the invention is a laser processing apparatus for irradiating a work with a laser beam so as to process the work with the laser beam, having a laser oscillator for oscillating a laser beam, a beam scan optical system including a scanner and a processing lens for positioning the laser beam emitted from the laser oscillator, on the work, and a beam splitter disposed between the processing lens and the work, wherein the work is processed with the laser beam reflected by the beam splitter.

A sixth constitution of the present invention is a laser processing apparatus for irradiating a work with a laser beam so as to process the work with the laser beam, having a laser oscillator for oscillating a laser beam, a beam scan optical system including a scanner and a processing lens for positioning the laser beam emitted from the laser oscillator, on the work, and a dichroic mirror disposed between the processing lens and the work, wherein the work is processed with the laser beam reflected by the dichroic mirror.

A seventh constitution of the present invention is a laser processing apparatus for irradiating a work with a laser beam so as to process the work with the laser beam, having a laser oscillator for oscillating a laser beam, a beam scan optical system including a scanner and a processing lens for positioning the laser beam emitted from the laser oscillator, on the work, an optics disposed between the processing lens and the work and for transmitting light emitted from the work, and a sensing means for sensing the light transmitted by the optics.

According to the present invention, a hole can be processed in the conductor layers and the insulating layers by required minimum energy so that the processing efficiency can be improved. Since there occurs no damage in the conductor layers and the insulating layers, the densification of the printed circuit board can be improved.

In the laser processing apparatus, a light emitting plume generated at the time of processing or a reflected beam of a processing laser is introduced into the fθ lens through the quarter wave plate, the beam splitter, the dichroic mirror or the like. Accordingly, the SN ratio of a detection signal is improved. As a result, the processed condition can be determined surely even if the detection signal is faint. Thus, high-quality processing can be performed.

DETAILED DESCRIPTION OF THE INVENTION

The present invention will be described below based on its embodiments and with reference to the drawings.

First Embodiment

Figure 1:
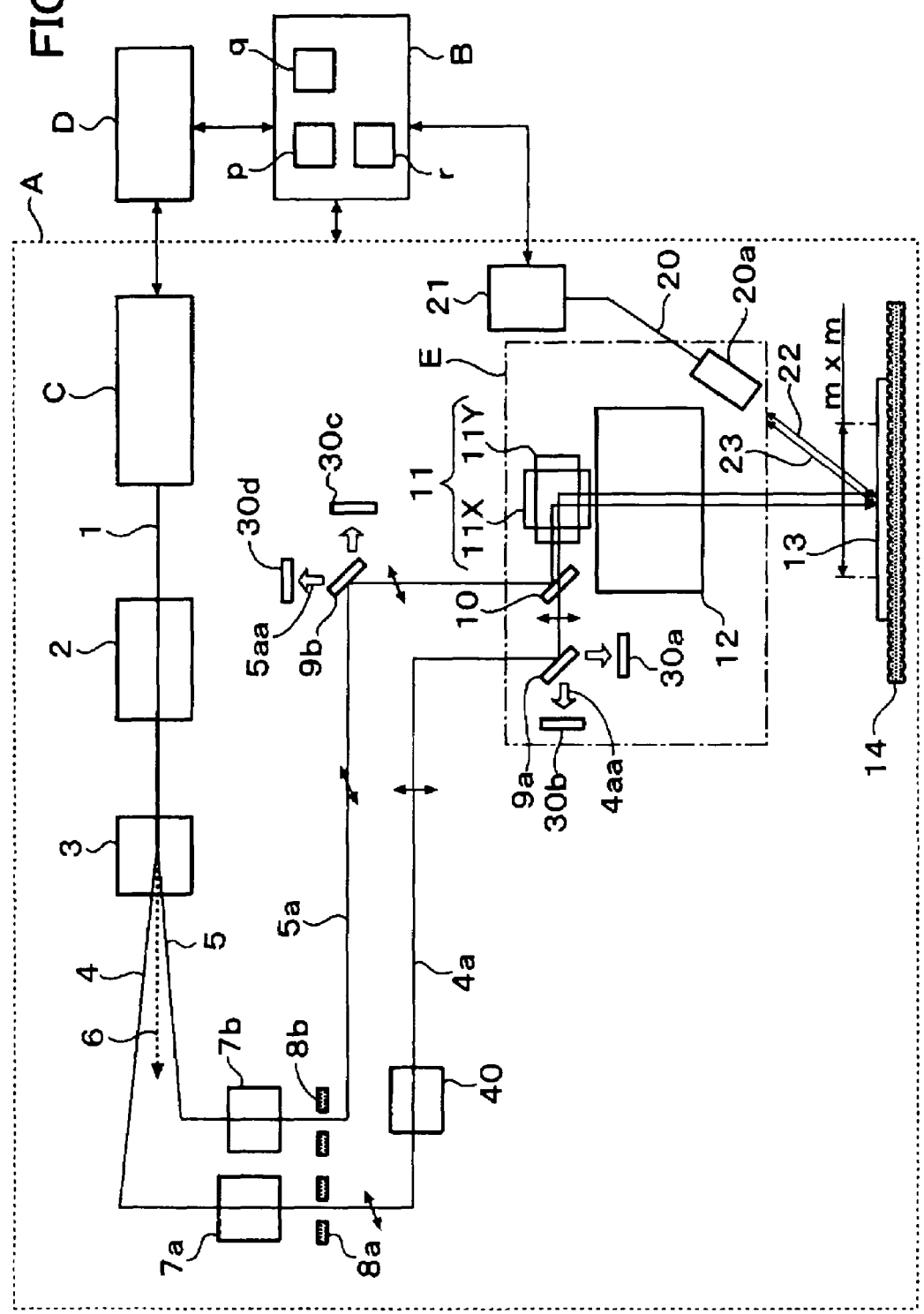
FIG. 1 is a configuration diagram of a printed circuit board perforating apparatus according to a first embodiment of the present invention.

FIG. 1 is a configuration diagram of a printed circuit board perforating apparatus according to a first embodiment of the present invention.

A system controller B is connected to an apparatus mechanism portion A surrounded with a dashed dotted line, a laser oscillator controller D and a photo-sensor 21. As will be described later, the system controller B has a comparison means p for comparing outputs from the photo-sensor 21 and photo-sensors 30a-30d with a predetermined threshold value, a counter q for counting the number of pulses of irradiation of a processed portion irradiated with a laser beam till the comparison means p operates, and a storage unit r for storing processing conditions and the counted number of pulses of irradiation.

Energy density suitable for processing copper and energy density suitable for processing an insulator are stored in the storage unit r in advance. In the storage unit r, the diameter of a laser beam for processing copper and set values of a laser oscillator and respective optical systems for processing copper are stored in the form of a table for each beam mode ("beam mode" means an energy distribution in a section perpendicular to the optical axis). The laser beam based on these set values has energy density suitable for processing copper. In the same manner, the diameter of a laser beam for processing the insulator and set values of the laser oscillator and the respective optical systems for processing the insulator are stored in the form of a table. The laser beam based on these set values has energy density suitable for processing the insulator.

When the system controller B is instructed about the beam mode and the laser beam diameter, the system controller B sets the laser oscillator and the respective optical systems so as to irradiate the to-be-processed portion with a laser beam suitable for processing.

The apparatus mechanism portion A has a laser oscillator C, a processing head E, optical systems, etc., as surrounded by the dashed dotted line. The optical systems optically connect the laser oscillator C with the processing head E.

The laser oscillator C outputs a pulsed linear-polarized UV laser beam (wavelength is 355 nm here), which is a Gaussian beam with a Gaussian-curved beam mode. A beam shaper 2 and a beam deflector 3 (for example, AOM of an acoustooptical system or EOM of an electrooptical system) are disposed on the optical axis of a laser beam 1 output from the laser oscillator C.

For example, the beam shaper 2 can convert a Gaussian beam into a top-hat beam serving as a beam mode in which the energy distribution is uniform, and/or can adjust the beam diameter of the laser beam 1.

The beam deflector 3 outputs the incident laser beam 1 as a first-direction laser beam 4 (primary light) and/or a laser beam 6 (zero-order light), that is, a laser beam 4 whose energy is Q % (Q=100 to 0) of the laser beam 1 and a laser beam 6 whose energy is (100−Q)% of the laser beam 1, or as a second-direction laser beam 5 (primary light) and/or a rectilinear-direction laser beam 6, or as a laser beam 6 in accordance with a command from the system controller B. When the ratio between the primary light and the zero-order light is changed, the level of the energy of the laser beam 4 or the laser beam 5 can be adjusted. In addition, the number of pulses of the laser beam 1 can be controlled. It is assumed here that the laser beam 4 and the laser beam 5 are S-polarized.

A beam diameter adjusting collimator 7a, an aperture 8a, a polarization direction rotation unit 40, a beam splitter 9a and a polarizing beam splitter 10 are disposed on the optical axis of the laser beam 4 between the beam deflector 3 and a mirror 11X. The aperture 8a adjusts the diameter of a processing spot at the time of mask projection processing. The laser beam 4 transmitted through the aperture 8a will be referred to as "laser beam 4a".

The photo-sensors 30a and 30b capable of sensing light with a wavelength of 300-800 nm are disposed on an extension of the optical axis of the laser beam 4a on the side where the laser beam 4a is incident on the beam splitter 9a and an extension of the optical axis of the laser beam 4a on the side where the laser beam 4a is reflected by the beam splitter 9a, respectively.

The beam splitter 9a reflects 99% of light with a wavelength of 300-800 nm, and transmits 1% of the light. The polarizing beam splitter 10 reflects incident S-polarized and transmits incident P-polarized.

The polarization direction rotation unit 40 is constituted, for example, by a plurality of reflecting mirrors, so as to rotate the polarization direction of incident light by 90 degrees.

A galvanometer scanner 11 is constituted by mirrors 11X and 11Y.

A beam diameter adjusting collimator 7b, an aperture 8b, a beam splitter 9b and the polarizing beam splitter 10 are disposed on the optical axis of the laser beam 5 between the beam deflector 3 and the galvanometer scanner 11. The aperture 8b adjusts the diameter of a processing spot at the time of mask projection processing. The laser beam 5 transmitted through the aperture 8b will be referred to as "laser beam 5a".

The beam splitter 9b reflects 99% of light with a wavelength of 300-800 nm, and transmits 1% of the light. The photo-sensors 30c and 30d capable of sensing light with a wavelength of 300-800 nm are disposed on an extension of the optical axis of the laser beam 5 on the side where the laser beam 5 is incident on the beam splitter 9b and an extension of the optical axis of the laser beam 5 on the side where the laser beam 5 is reflected by the beam splitter 9b, respectively.

A processing table 14 disposed in a position facing the processing head E can move in X and Y directions. A work for printed circuit board 13 to be processed is mounted on the processing table. An m×m range designated by the arrow in FIG. 1 is a scan area of the galvanometer scanner 11.

In FIG. 1, corner mirrors but ones required for description are not shown.

One end of an optical fiber 20 provided with a condensing optical system 20a in its forward end is disposed in a position, for example, about 40 mm distant from the to-be-processed portion so as to face the scan area. The other end of the optical fiber 20 is connected to the photo-sensor 21. The optical fiber 20 has a filter effect and selectively transmits light with a wavelength of 400-600 nm to the photo-sensor 21.

Next, the operation of this embodiment will be described.

First, the path of the laser beam 4 will be described.

The energy distribution and the beam diameter of the pulsed laser beam 1 output from the laser oscillator C are set by the beam shaper 2. The laser beam 1 is incident on the beam deflector 3 so that the level of the pulse energy is adjusted. The laser beam 1 is output as one of the laser beams 4, 5 and 6.

The outer diameter of the laser beam 4 is set by the beam diameter adjusting collimator 7a and the aperture 8a. Thus, the laser beam 4 is formed into a laser beam 4a (S-polarized here). The laser beam 4a is converted into a P-polarized by the polarization direction rotation unit 40. The laser beam 4a is incident on the beam splitter 9a. A part of the laser beam 4a is transmitted through the beam splitter 9a and incident on the photo-sensor 30a, while the rest of the laser beam 4a is reflected by the beam splitter 9a. The laser beam 4a reflected by the beam splitter 9a is transmitted through the polarizing beam splitter 10 and incident on the mirror 11X. The position where the laser beam 4a will be incident on the printed circuit board 13 is set by the mirror 11X and the mirror 11Y. The laser beam 4a is incident on the printed circuit board 13 through the focusing lens (fθ lens) 12 so as to process the printed circuit board 13.

Light composed of a part of reflected light 22 of the laser beam 4a reflected by the printed circuit board 13 and a part of processing light 23 emitted from the processed portion is incident on the optical fiber 20. In addition, a part of the reflected light 22 and a part of the processing light 23 go backward in the incoming path, partially pass the beam splitter 9a, and enter the photo-sensor 30b as a transmitted light 4aa.

The outer diameter of the laser beam 5 is set by the beam diameter adjusting collimator 7b and the aperture 8b. Thus, the laser beam 5 is formed into a laser beam 5a (S-polarized here). A part of the laser beam 5a is transmitted through the beam splitter 9b and incident on the photo-sensor 30c, while the rest of the laser beam 5a is reflected by the beam splitter 9b. The reflected laser beam 5a is incident on the polarizing beam splitter 10. The laser beam 5a reflected by the polarizing beam splitter 10 is incident on the mirror 11X. The position where the laser beam 5a will be incident on the printed circuit board 13 is set by the mirror 11X and the mirror 11Y. The laser beam 5a is incident on the printed circuit board 13 through the focusing lens (fθ lens) 12 so as to process the printed circuit board 13.

Light composed of a part of reflected light 22 (here, the reflected light of the laser beam 5a is also referred to as "reflected light 22") of the laser beam 5a reflected by the printed circuit board 13 and apart of processing light 23 emitted from the processed portion is incident on the optical fiber 20. In addition, a part of the reflected light 22 and a part of the processing light 23 go backward in the incoming path, are reflected by the polarizing beam splitter 10, partially pass the beam splitter 9b, and enter the photo-sensor 30d as a transmitted light 5aa.

The laser beam 6 is incident on a not-shown apparatus, in which the laser beam 6 is converted into heat.

Next, description will be made on the processing procedure according to the present invention.

Here, description will be made on the case where a printed circuit board having $\underline{n}$ copper layers and $\underline{n}$ or $(n-1)$ insulating layers laminated alternately so that the first layer from the surface of the printed circuit board is a copper layer is perforated.

Figure 2:
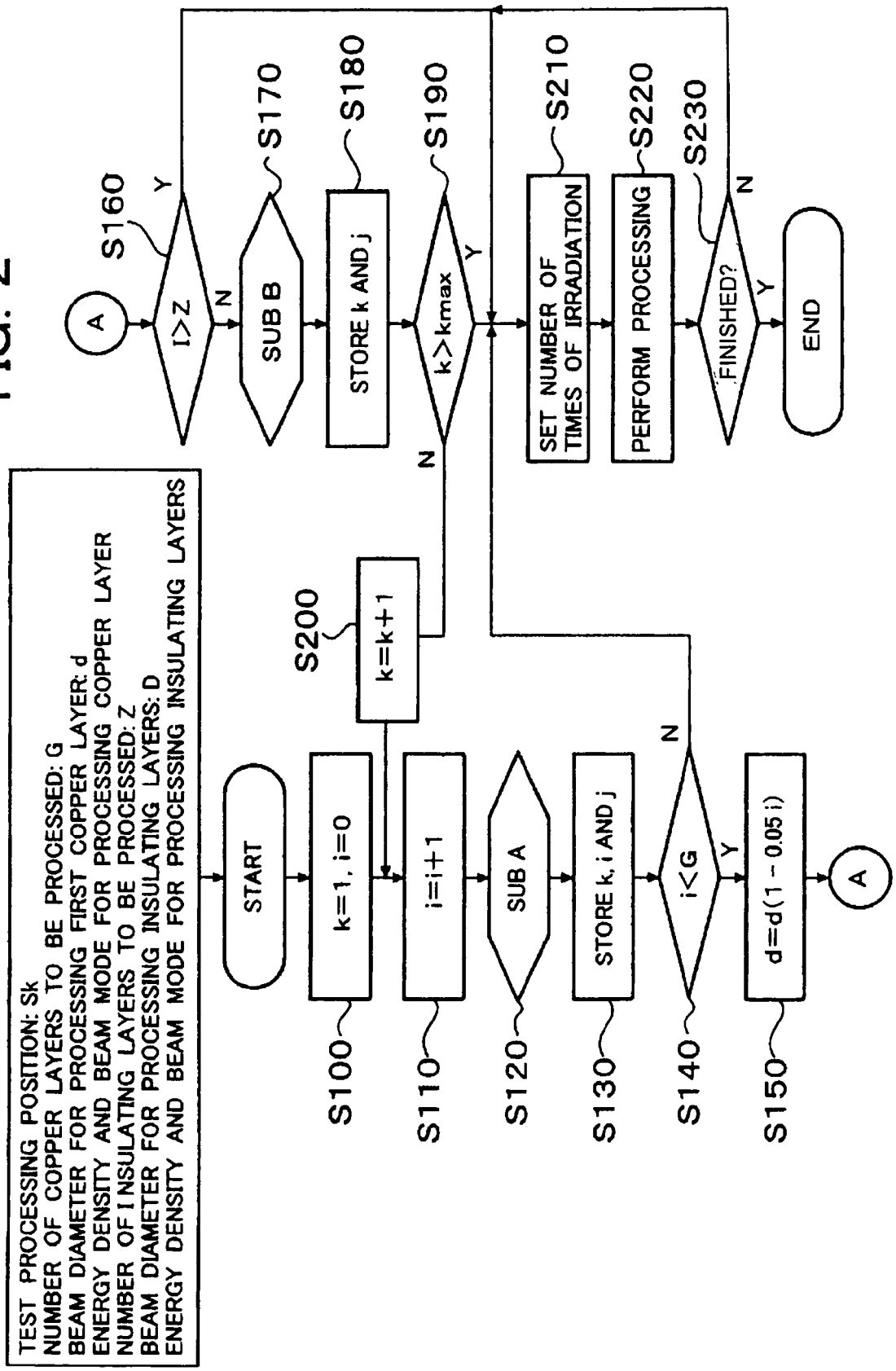
FIG. 2 is a flow chart showing a processing procedure according to the first embodiment.
Figure 3:
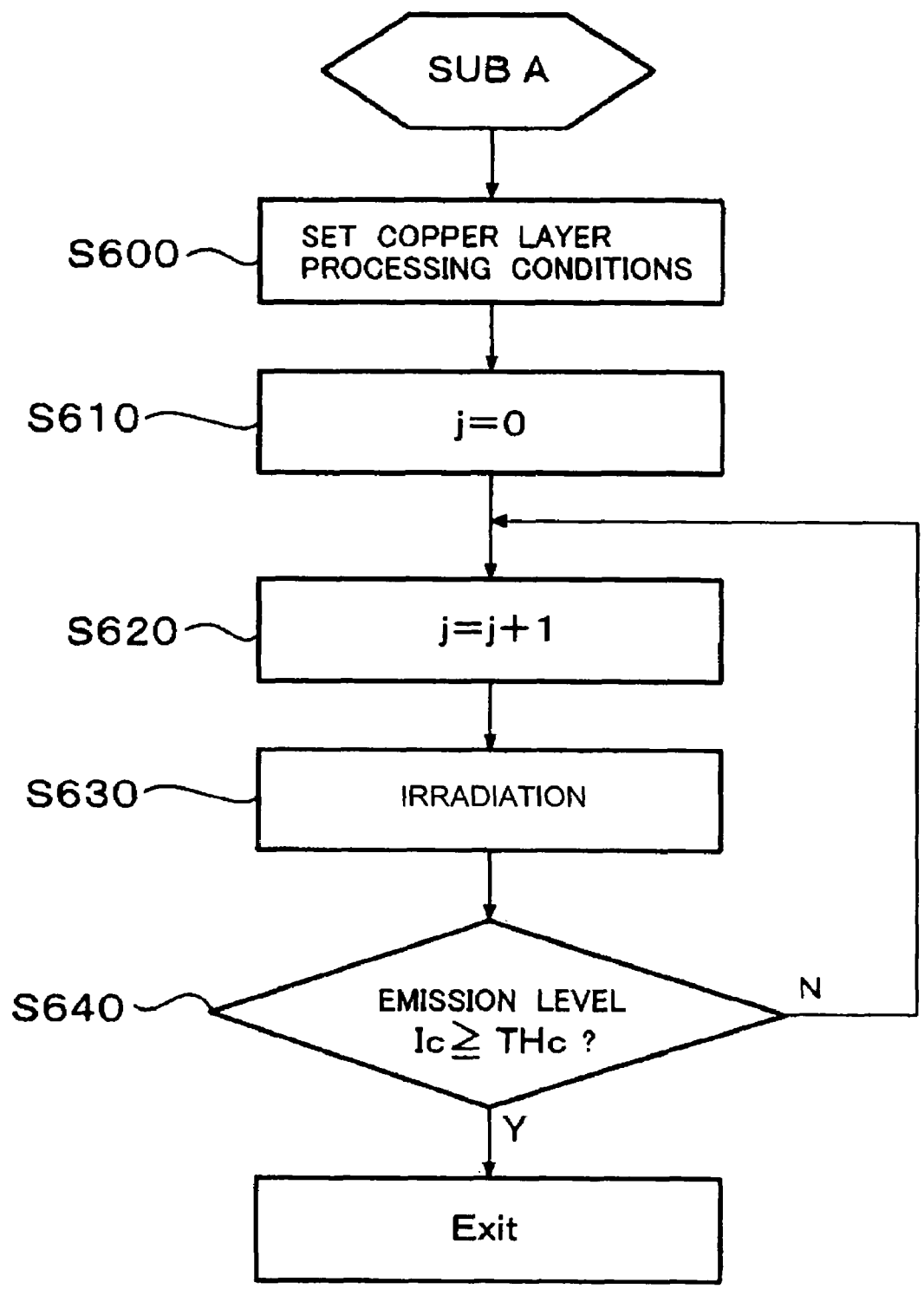
FIG. 3 is a flow chart of a subroutine in the processing procedure of FIG. 2.
Figure 4:
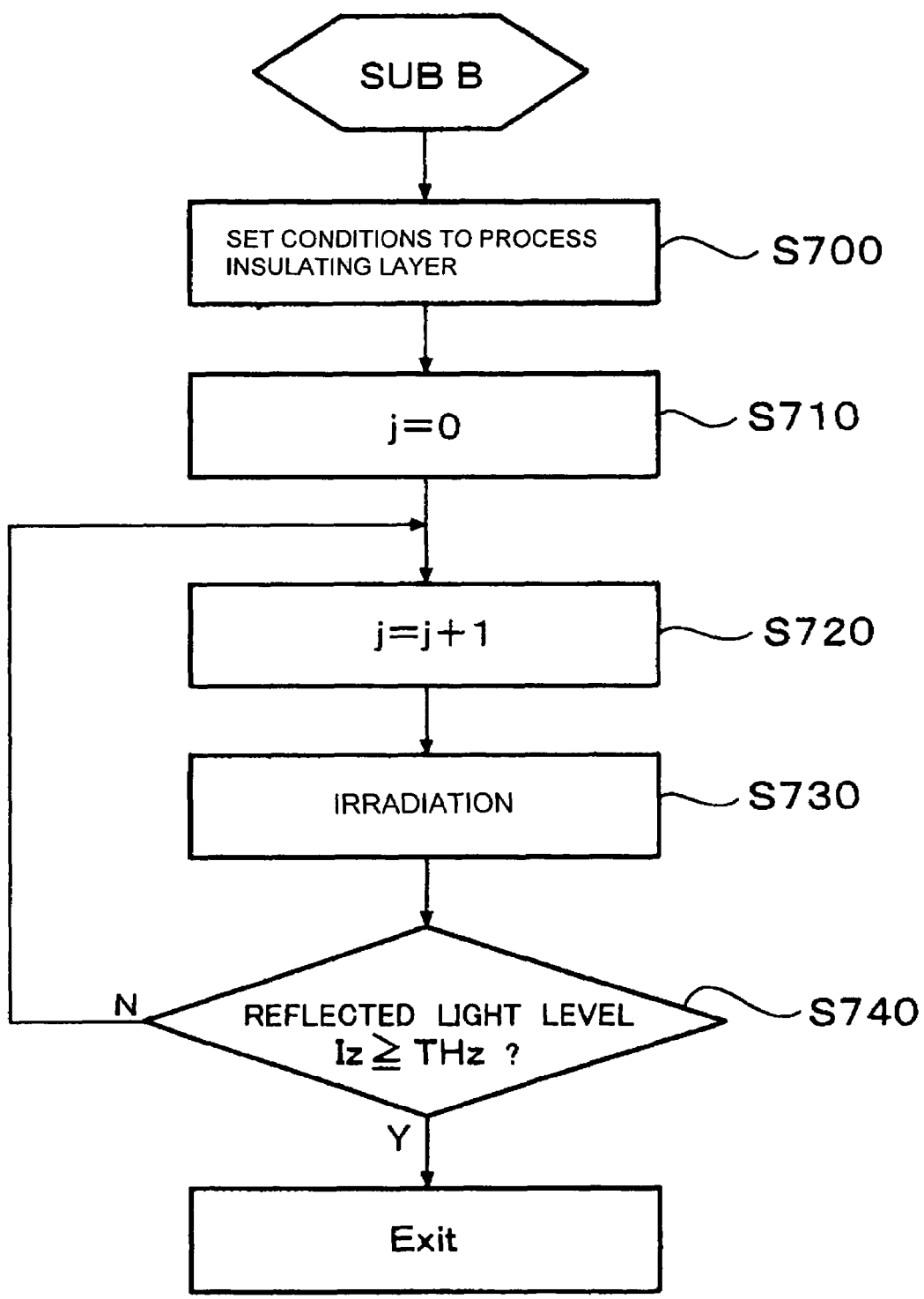
FIG. 4 is a flow chart of a subroutine in the processing procedure of FIG. 2.

FIG. 2 is a flow chart showing the processing procedure according to the present invention. FIGS. 3 and 4 are flow charts of subroutines.

Prior to processing, the following parameters are set as processing conditions:

(1) Sk: coordinates of a test processing position ($\underline{k}$ designates a position number of the processing position, ranging from 1 to max);
(2) G: the number of copper layers to be processed;
(3) Z: the number of insulating layers to be processed;
(4) D: a laser beam diameter for processing the insulating layers;
(5) energy density and a beam mode for processing the insulating layers;
(6) $\underline{d}$: a laser beam diameter for processing the first copper layer; and
(7) energy density and a beam mode for processing the copper layers.

Here, assume that the copper layers are processed with the laser beam 4a whose energy density is 8 $J/cm^2$ and whose beam mode is a top-hat type, and the insulating layers are processed with the laser beam 5a whose energy density is 1 $J/cm^2$ and whose beam mode is a top-hat type. In addition, assume that the laser beam diameter $\underline{d}$ is set to be equal to the diameter of a hole to be processed, and the diameter D is a value larger than the diameter $\underline{d}$. More than one portion which will not be any products of the printed circuit boards in the work 13 is selected as the test processing position Sk.

When a not-shown processing start button is turned on, the position number $\underline{k}$ is set at 1, and the layer number $\underline{i}$ is set at 0 (Step S100). After that, the layer number $\underline{i}$ is set at 1 (Step S110). Subroutine SUB A shown in FIG. 3 is executed (Step S120), and Step S130 is then performed.

In the subroutine SUB A, a processing beam is set in accordance with the conditions of the laser beam 4a (Step S600), and the number $\underline{j}$ of pulses of irradiation is reset as 0 (Step S610). After that, the number $\underline{j}$ of pulses of irradiation is increased by one (Step S620). Irradiation with the laser beam 4a is performed once (one pulse) (Step S630), and the existence of emission is checked (Step S640). That is, due to irradiation with the laser beam 4a, the copper layer is processed while reflected light 22 (wavelength 355 nm) of the laser beam 4a and processing light 23 having a wavelength of 300-800 nm with an intensity peak near 500-550 nm are emitted from the processed portion and partially incident on the optical fiber 20. The reflected light 22 is removed by the filter effect of the optical fiber 20. Processing light 23a with a wavelength of 400-600 nm (hereinafter referred to as "emission") passes the optical fiber 20 and reaches the photo-sensor 21 so as to turn on the photo-sensor 21.

The comparison means $\underline{p}$ compares an output Ic of the photo-sensor 21 with a predetermined threshold value THc. When the output Ic is larger than the predetermined threshold value THc, it is concluded that the copper layer remains (that is, processing of the copper layer has not yet been completed), and Step S620 is performed. Otherwise, that is, when it is concluded that a window has been processed in the copper layer, the subroutine SUB A is terminated (Step S640).

The laser beam 4a whose energy density is 8 $J/cm^2$ can remove the copper layer by depth of about 1 μm at one time of irradiation. Therefore, for example, when the copper layer is 9 μm thick, irradiation with the laser beam 4a is repeated about 9±1 times.

In Step S130, the number $\underline{j}$ of pulses of irradiation is stored together with the test processing position number $\underline{k}$ and the copper layer number $\underline{i}$. The number $\underline{i}$ is compared with the number G. Step S150 is performed when i<G, and otherwise Step S210 is performed (Step S140).

In Step S150, the diameter $\underline{d}$ of the laser beam 4a is replaced by (1−0.05i)d. After that, the copper layer number $\underline{i}$ is compared with the number Z (Step S160). When i<Z, a subroutine SUB B shown in FIG. 4 is executed (Step S170), and Step S180 is performed. Otherwise Step S210 is performed. When the diameter $\underline{d}$ of the laser beam 4a is replaced by (1−0.05i)d, the aperture 8a is changed over to the aperture 8a with a diameter corresponding to the diameter (1−0.05i)d.

In the subroutine SUB B, a processing beam is set in accordance with the conditions of the laser beam 5a with a diameter D, and the number $\underline{j}$ of pulses of irradiation is reset as 0 (Steps S700 and S710). After that, the number $\underline{j}$ of pulses of irradiation is increased by one (Step S720). Irradiation with the laser beam 5a is performed once (Step S730), and intensity Iz of reflected light is checked (Step S740). That is, in the case where there is a copper layer under an insulating layer, the intensity Iz of the reflected light 22 reflected by the copper layer exposed when the insulating layer has been removed is much higher than the intensity Iz of the reflected light 22 when the insulating layer is being processed. Therefore, the intensity Iz of the reflected light 22 input to the photo-sensor 21 is compared with a predetermined threshold value THz. When the intensity Iz is lower than the predetermined threshold value THz, it is concluded that the insulating layer remains (that is, processing of the insulating layer has not yet been completed), and Step S720 is performed. Otherwise, that is, when it is concluded that a window has been processed in the insulating layer, the subroutine SUB B is terminated.

In Step S180, the number $j$ of pulses of irradiation is stored together with the test processing position number $k$ and the copper layer number $i$.

The test processing position number $k$ is compared with a value kmax (Step S190). When k<kmax, the test processing position number $k$ is increased by one (Step S200) and Step S110 is then performed. Otherwise (that is, when k≧kmax) Step S210 is performed.

In Step S210, of the numbers $j$ of pulses of irradiation over the first copper layer or insulating layer in test processing positions S1 to Smax, the largest number $j$ of pulses of irradiation is set as the number of pulses of irradiation for processing each copper layer or insulating layer. Then, perforating for the first one of commanded holes is performed (Step S220). In the same manner, processing is performed till perforating all over the commanded holes is finished (Step S230).

According to the present invention, the number of pulses of irradiation enough to process a window for each of the copper layers and the insulating layers to be perforated is determined by test processing (Step S100 to Step S210 in FIG. 2), and actual processing is performed using the determined number of pulses of irradiation (Step S220 and Step S230 in FIG. 2). Accordingly, even when the thickness differs from one layer to another, the quality can be made uniform, and the control is easy.

In this embodiment, the diameter of the laser beam 4a processing the second and following copper layers is reduced gradually. Accordingly, the entrance diameter of a processed hole is not damaged, but high-quality processing can be performed.

In addition, the number of pulses of irradiation required for processing the insulating layer is confirmed. Accordingly, it is not necessary to make the number of pulses of irradiation larger than necessary, and the processing efficiency can be improved.

Further, according to this processing procedure, it is possible to process not only a blind hole reaching a desired conductor layer from the surface but also a through hole.

The energy density of the laser beam 5a is not intensive enough to damage the conductor layer. Therefore, the number of pulses of irradiation with the laser beam 5a does not have to be measured, but irradiation with the laser beam 5a may be performed a number of pulses obtained by adding a margin to the maximum value of the insulating layer thickness on design.

The number of pulses of irradiation with a laser beam for each layer is set as a maximum value obtained by measurement of the thickness of the layer. However, in the case where the thickness of each layer is known in advance, for example, an alarm may be given when the number of pulses of irradiation is out of an allowable range determined in advance.

The outputs of the photo-sensors 30a and 30c may be monitored. When, for example, the output of the laser beam 4a or the laser beam 5a is reduced for some reason, the number of pulses of irradiation for processing may be determined excluding a presently measured value of the layer thickness.

The energy density and the laser beam diameter $d$ of the laser beam 4a for test processing may be set as fixed values. After the number of pulses of irradiation required for processing a window in each layer is determined, trial processing with a laser beam corresponding to the diameter of a hole to be processed may be performed without changing the energy density, and the result of the trial processing may be evaluated.

Although the beam mode is set as a top-hat type in which the energy distribution is substantially uniform in the radial direction, the beam mode may be set as a Gaussian type in which the energy distribution has a Gaussian curved shape.

Although the diameter $d$ of the laser beam 4a for processing the second and following copper layers is replaced by $(1-0.05i)d$ (Step S150 in FIG. 2), the second and following copper layers may be processed with the laser beam 4a of the diameter $d$.

The spot diameter on the to-be-processed portion may be controlled by the collimator 7, or controlled by changing the distance between the aperture 8a (or 8b) and the to-be-processed portion.

The intensity of the reflected light 22 varies in accordance with the angles of the mirror 11X and the mirror 11Y (that is, the signal level from a processed portion at a distance from the lens center decreases in accordance with the distance). Accordingly, when the level of a detection signal is corrected in accordance with the angles of the mirror 11X and the mirror 11Y, the detection accuracy can be further improved.

Light incident on the photo-sensor 30b or the photo-sensor 30d may be split into two, one of which is used for detecting light with a wavelength of 355 nm, and the other of which is used for detecting light with a wavelength of 400-600 nm.

Although the energy density for processing the insulating layer is fixed in the aforementioned embodiment, the energy density may be changed halfway through processing.

Figure 5A:
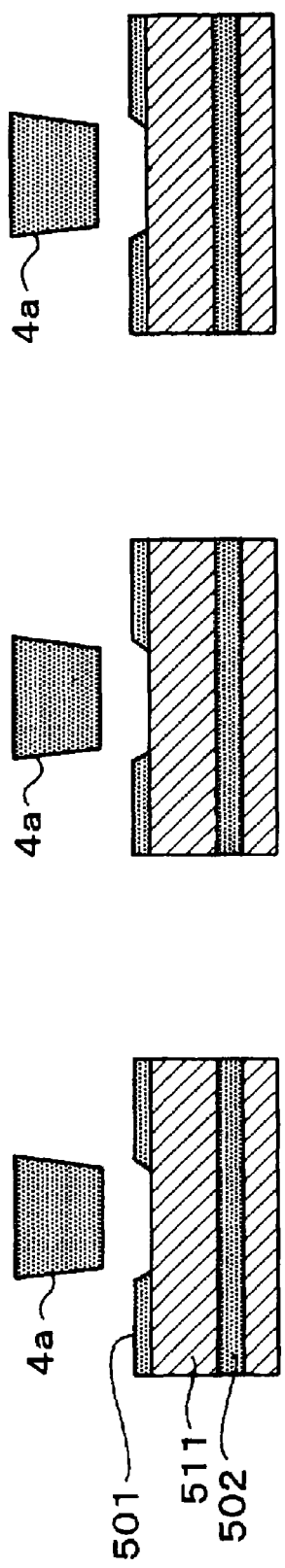
FIGS. 5A-5C are schematic views showing shapes of a processed portion according to the first embodiment.
Figure 5B:
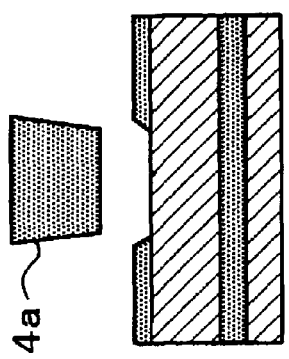
Figure 5C:
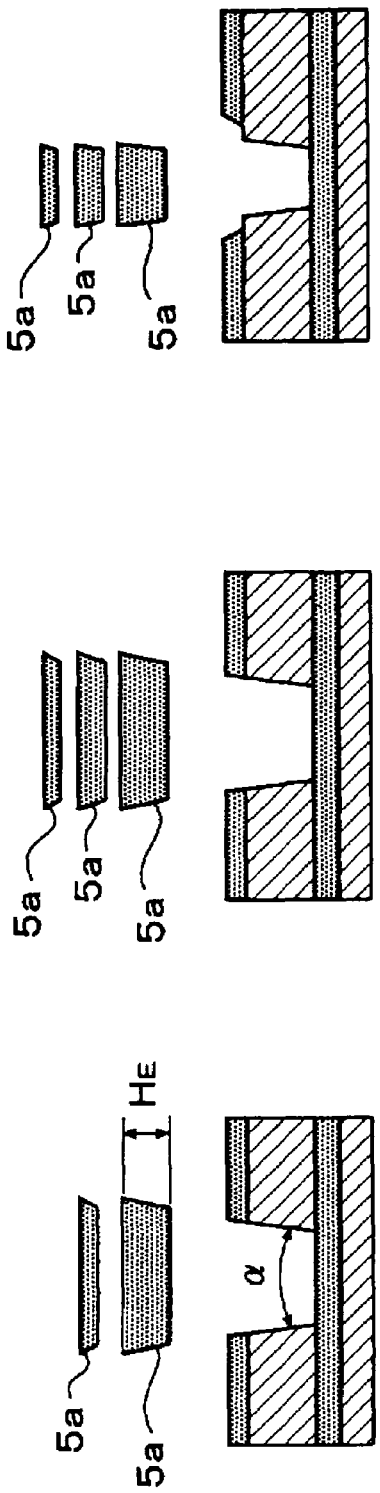

FIGS. 5A-5C are schematic views showing shapes of a processed portion in the aforementioned processing procedure. A suffix $i$ is given to each conductor layer 50i and each insulating layer 51i of the printed circuit board 13 so that the suffix $i$ is 1 for the uppermost (surface side) ones in FIGS. 5A-5C. In FIGS. 5A-5C, the upper row designates the cases where a copper layer is processed, and the lower row designates the cases where an insulating layer is processed. Energy density $H_E$ in each case is expressed by height.

As shown in FIG. 5A, when processing of an insulating layer 511 is started (that is, immediately after processing of a copper layer 501), the energy density may be made high but low enough not to process the upper layer 501 (for example, 3 J/cm$^2$). After the insulating layer 511 is processed by about 70% of its thickness on design, the energy density is set to be 1 J/cm$^2$. When the energy density of the laser beam is controlled thus, the processing efficiency can be improved, and the insulating layer can be prevented from remaining in the hole bottom.

As shown in FIG. 5B, the energy density for processing an insulating layer may be varied in three levels. When the energy density of a laser beam is controlled thus, the side wall of a hole to be formed can be made smooth.

When the first conductor layer and the second conductor layer are connected with each other, the diameter D of the laser beam 5a for processing the first insulating layer may be made smaller than the diameter d of the laser beam 4a as shown in FIG. 5C. In such a manner, a constituent member of the insulating layer gasified by processing is exhausted rapidly from the surface so that a hole with a smooth side surface can be formed.

In any case, plating with less defect can be performed in a plating process if the shape of the laser beam 5a is controlled so that a taper angle α of the side surface formed in an insulating layer is 10-90°.

Here, the taper angle α of the inner surface of a hole can be changed by controlling the beam shaper to thereby control the radial energy distribution of a laser beam. That is, for example, the taper angle α can be increased when the rate with which the energy density in the center portion of the laser beam is reduced radially toward the peripheral portion is increased.

Next, description will be described on a specific example.

PROCESSING EXAMPLE 1

An RCC material (glass containing substrate) having a copper layer thickness of 12 μm and an insulating layer thickness of 60 μm was processed with a top-hat beam of a laser beam 4a (with a pulse frequency f of 30 KHz) with an energy density of 8 J/cm$^2$ and a diameter of 45 μm. In this case, a window could be formed in the first conductor layer by 11 pulses. In this event, the depth of a hole formed in the first insulating layer was not larger than 3 μm. It was confirmed that the first insulating layer was hardly processed with the laser beam 4a.

The energy density was set stepwise (1.6, 1.0 and 0.8 J/cm$^2$) in accordance with the remaining thickness of an insulating layer, and three-step processing was performed with a total of 70 pulses. Also in this case, it was confirmed that good hole quality and hole shape could be obtained.

When the energy density was 1 J/cm$^2$, there was no case that a copper layer just under an insulating layer was damaged or the shape of a hole formed in the insulating layer was defective in spite of extra irradiation with about 10 pulses after the insulating layer had been removed.

In order to prevent the hole quality from deteriorating due to high-temperature decomposed substances, it is desired that so-called cycle processing (for example, when irradiation with a laser beam is performed 20 pulses for forming one hole, five to-be-processed portions are grouped, and a cycle in which the five to-be-processed portions are irradiated once one by one with the laser beam is repeated 20 pulses) is performed in real processing.

Here, the diameter of the laser beam for processing the n-th conductor layer was set to be 95% of the diameter of the laser beam for processing the (n−1)th conductor layer. It is, however, preferable that the diameter of the laser beam for processing the n-th conductor layer is made equal to the diameter of the bottom of the hole processed by the laser beam for processing the (n−1)th conductor layer.

The present invention is not limited to a punching method, but it can be applied to a trepanning method which is a method for processing a hole with a laser beam having a smaller diameter than the diameter of the hole.

Most of the laser beam 4a reflected by the mirror 11 and entering the focusing lens 12 is transmitted through the focusing lens 12. However, a small minority of the laser beam 4a is reflected by the surface of the focusing lens 12, and goes backward in the incoming path so as to enter the photo-sensor 30b. That is, the laser beam 4a reflected by the processed portion and the laser beam 4a reflected by the surface of the focusing lens 12 are incident on the photo-sensor 30b simultaneously. In this embodiment, it is necessary to identify only the laser beam 4a reflected by the processed portion. The laser beam 4a reflected by the surface of the focusing lens 12 is regarded as noise. Therefore, the intensity range of the laser beam 4a reflected by the surface of the focusing lens 12 is obtained in advance. The intensity of the laser beam 4a reflected by the surface of the focusing lens 12 is subtracted from a detected value of the photo-sensor 30b. When the intensity obtained thus is used as the intensity of the reflected light 22, it is possible to improve the detection accuracy when perforating a conductor layer being processed is finished and the detection accuracy when perforating an insulating layer is finished.

Second Embodiment

When the intensity of the reflected light 22 incident on the photo-sensor 30b is low, the detection accuracy may be lowered.

Next, description will be made on a modification of the present invention.

Figure 6:
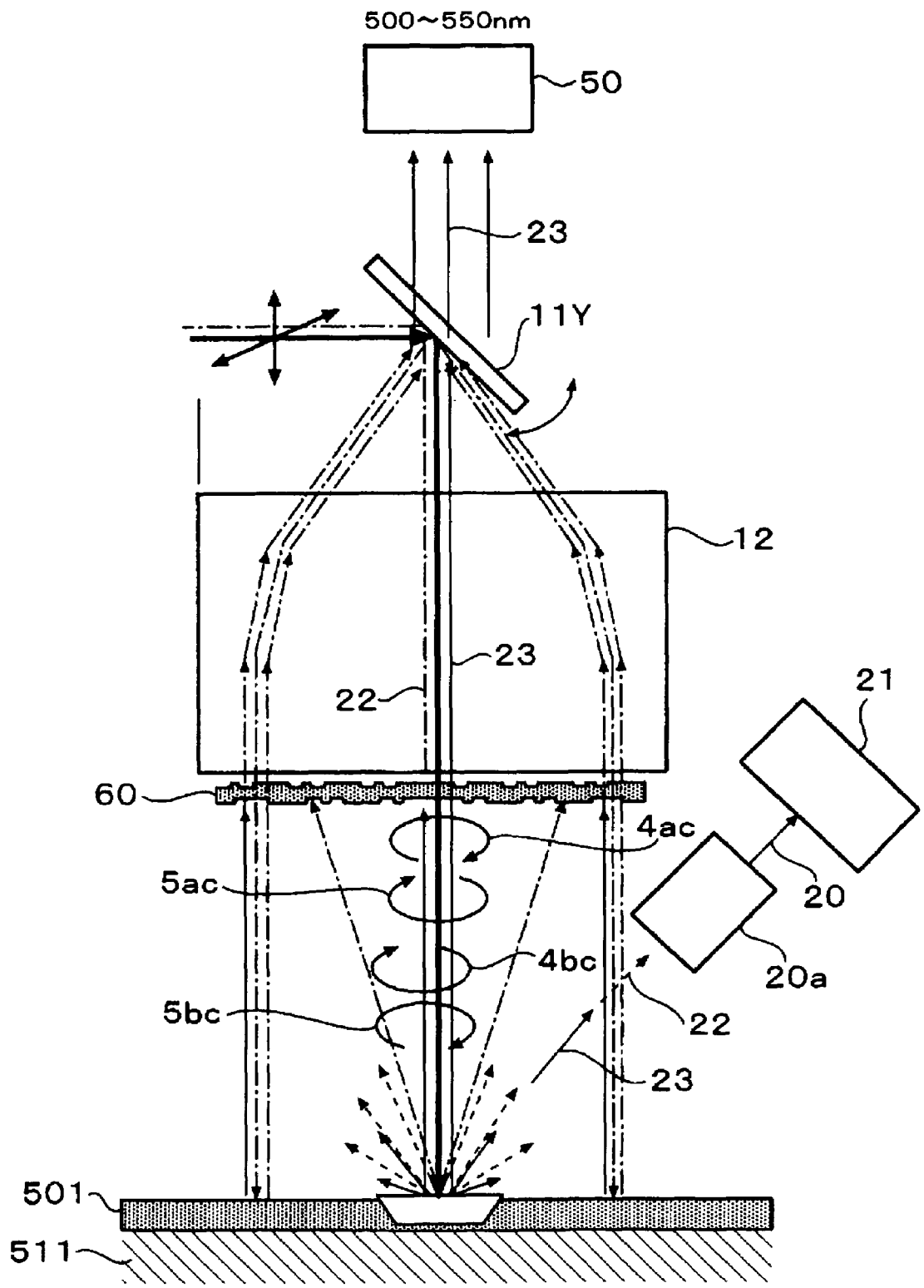
FIG. 6 is a front view of the vicinity of a processing head according to a second embodiment of the present invention.

FIG. 6 is a front view of the vicinity of a processing head according to the modification (second embodiment) of the present invention.

A ¼-λ plate 60 is disposed on the printed circuit board 13 side of the focusing lens 12.

The ¼-λ plate 60 is characterized by outputting incident linearly polarized light in the form of circularly polarized light, and outputting incident circularly polarized light in the form of linearly polarized light. When circularly polarized light is reflected, for example, by a mirror, the polarization direction of the reflected circularly polarized light is reversed, that is, the rotation direction thereof is changed by 180 degrees. Therefore, when the circularly polarized light whose rotation direction has been reversed is incident on the ¼-λ plate 60 again, the polarization direction thereof is rotated by 90 degrees with respect to the polarization direction at the time of the incidence. That is, for example, when the light incident on the ¼-λ plate 60 is a P-polarized, the light reflected by the processed portion and output from the ¼-λ plate 60 (that is, the reflected light 22) is an S-polarized.

The mirror 11Y is constituted by a beam splitter transmitting light with a wavelength of 500-550 nm, and a photo-sensor 50 is disposed on the transmission side of the mirror 11Y. The photo-sensor 50 detects light having a wavelength of 500-550 nm and reflected from a copper layer.

Next, the operation of the second embodiment will be described.

A linearly polarized (P-polarized) laser beam 4a incident on the ¼-λ plate 60 is emitted from the ¼-λ plate 60 as a circularly polarized laser beam 4a (4ac in FIG. 6). The circularly polarized laser beam 4a is incident on a processed portion. Even when the light is changed from linearly polarized light to circularly polarized light in terms of the polarization direction, there is no change in the energy. It is therefore possible to obtain the same processing result as that in the case of processing with linearly polarized light.

Reflected light 22 circularly polarized laser beam 4ac) reflected by the processed portion goes backward in the incoming path, and leaves the ¼-λ plate 60 as S-polarized reflected light 22. The S-polarized reflected light 22 is reflected by the polarizing beam splitter 10, and incident on the photo-sensor 30d. On the other hand, the laser beam 4a reflected on the surface of the focusing lens 12 passes the polarizing beam splitter 10 and enters the photo-sensor 30b.

That is, according to this embodiment, the detection accuracy of the reflected light 22 can be made high when the output of the photo-sensor 30*d* is monitored.

In the same manner, the detection accuracy of the reflected light 22 of the laser beam 5*a* can be made high when the output of the photo-sensor 30*b* is monitored.

Here, when the depth of a hole processed is increased, the intensity of emission 23*a* becomes lower. Therefore, the detection accuracy of the photo-sensor 21 may be lowered. The crossing angle between the axis of the photo-sensor 50 and the axis of the hole being processed is smaller than the crossing angle between the axis of the photo-sensor 21 and the axis of the hole being processed. Accordingly, the intensity of the emission 23*a* incident on the photo-sensor 50 is higher than the intensity of the emission 23*a* incident on the photo-sensor 21. Thus, the accuracy to identify the emission 23*a* can be improved when the output of the photo-sensor 50 is monitored.

The photo-sensors 30*a* and 30*c* may be replaced by a third beam splitter and a photo-sensor. The third beam splitter is disposed between the laser oscillator 1 and the beam deflector 3 so as to reflect 99% of light with a wavelength of 300-800 nm and transmit 1% of the light. The photo-sensor is disposed on the transmission side of the third beam splitter. In this case, the photo-sensors 30*a* and 30*c* do not have to be provided.

Though not shown, the beam splitter 9*a* may be replaced by a pair of beam splitters. The pair of beam splitters is disposed so that their rotation axes are skewed from each other. The beam splitters are designed so that each beam splitter can rotate around its rotation axis (that is, a pair of steerable mirrors are disposed instead of the beam splitter 9*a*). Thus, the irradiation positions of two beams are controlled individually so that two different sites on the printed circuit board can be processed.

Further, the laser beam 4*a*, 5*a* may be split, for example, into two by a beam splitter so that the two can be supplied to two processing heads respectively.

For example, when the area of one printed circuit board is wide, test processing may be performed again in the middle of processing. Reflected light or emission may be checked during processing by way of caution. In such a manner, the reliability of processing can be further improved.

The laser oscillator 1 generally has a frequency-output characteristic as follows. The output of the laser oscillator 1 increases till the frequency reaches a certain value. However, the output decreases after the frequency reaches the certain value. That is, the output characteristic of the laser oscillator 1 draws an upward convex curve when the abscissa designates the frequency and the ordinate designates the output.

The value of the energy density can be obtained by dividing the output by the frequency. Even when the value of the energy density is fixed, the processing conditions are not determined uniquely. However, according to experimental results, it is effective to increase both the output and the frequency when it is intended to increase the processing speed, and it is effective to reduce both the output and the frequency when it is intended to improve the processing quality.

Third Embodiment

Figure 7:
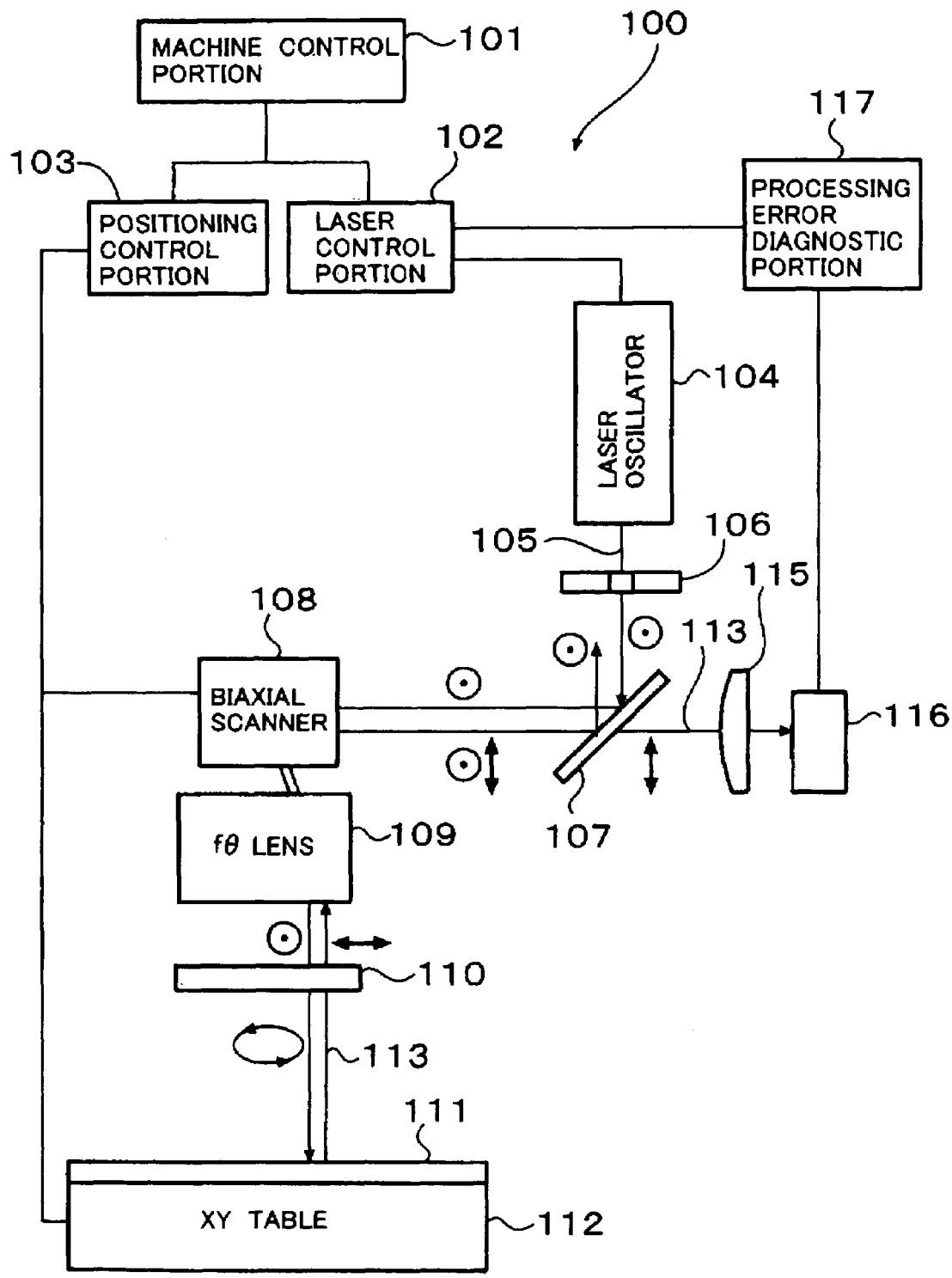
FIG. 7 is a block diagram showing the schematic configuration of a laser processing apparatus according to a third embodiment of the invention.

FIG. 7 is a block diagram showing the schematic configuration of a laser processing apparatus according to a third embodiment of the present invention. In FIG. 7, in the laser processing apparatus according to this embodiment, a machine control portion 101 has a positioning control portion 103 for positioning and controlling a board 111 mounted on an X-Y table 112, and a laser control portion 102 for controlling a laser beam 105 with which the board 111 will be irradiated. A laser oscillator 104 is connected to the laser control portion 102. The laser oscillator 104 emits the laser beam 105 based on a command from the laser control portion 102.

A mask 106 is disposed under the laser oscillator 104, and a polarizing beam splitter 107 is disposed further under the mask. The laser beam 105 emitted from the laser oscillator 104 is incident on the polarizing beam splitter 107 through the mask 106. The polarizing beam splitter 107 is disposed at an angle of 45 degrees with respect to the optical path of the laser beam 105 so as to change the direction of the laser beam 105 by 90 degrees. The laser beam 105 whose traveling direction has been changed is introduced into a biaxial scanner 108 which will be described in detail later. An fθ lens 109 is disposed under the biaxial scanner 108, and a quarter wave plate 110 is disposed between the fθ lens 109 and the board 111. The biaxial scanner 108 controls the angle of the laser beam 105 incident on the fθ lens 109. The laser beam 105 passes through the quarter wave plate 110 and is applied on a predetermined position of the board 111.

The laser beam 105 applied on the board 111 is reflected by a copper foil portion belonging to the board 111, so as to generate a board reflected beam 113. The board reflected beam 113 travels through the optical path in the opposite direction to the direction of the laser beam 105 emitted from the laser oscillator. That is, the board reflected beam 113 passes through the quarter wave plate 110, the fθ lens 109 and the biaxial scanner 108 and then reaches the polarizing beam splitter 107. In this polarizing beam splitter 107, the board reflected beam 113 is not reflected but transmitted by the polarizing beam splitter 107 differently from the laser beam 105. A condenser lens 115 to which the board reflected beam 113 transmitted thus will be introduced is disposed at the back of the polarizing beam splitter 107. The board reflected beam 113 condensed by this condenser lens 115 is introduced into an optical sensor 116. The optical sensor 116 converts the board reflected beam 113 into an electric signal. The converted signal is sent to a processing error diagnostic portion 117 and judged as to a processing error.

Figure 12:
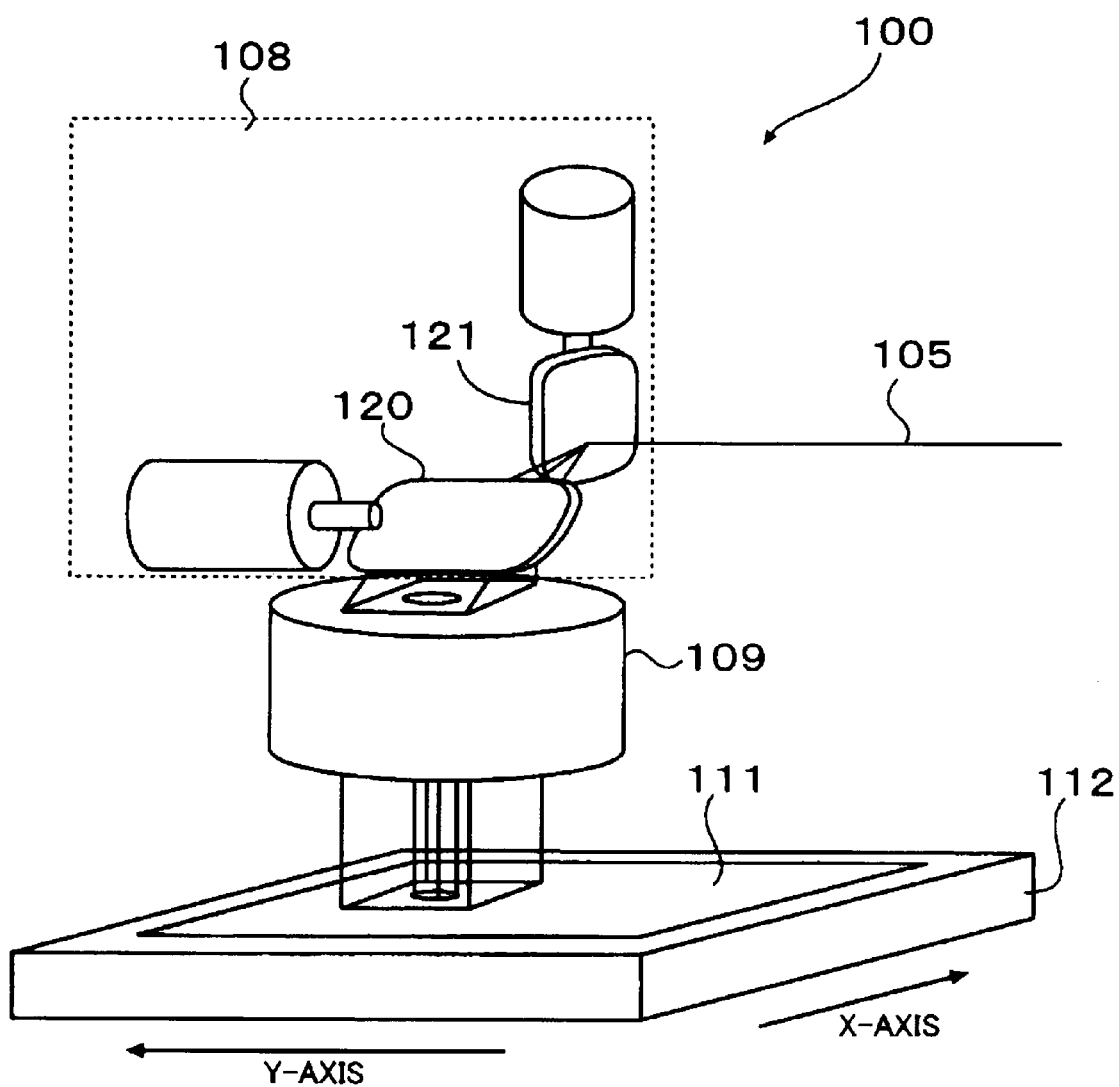
FIG. 12 is a perspective view of a biaxial scanner for use in the laser processing apparatus according to the second to seventh embodiments.

FIG. 12 is a perspective view showing the biaxial scanner 108. The biaxial scanner 108 has two steerable mirrors 120 and 121. One steerable mirror 120 can swing around a horizontal axis so as to make the laser beam 105 scan a to-be-processed area of the board 111 mounted on the XY stage 112 in the X-axis direction. The other steerable mirror 121 can swing around a vertical axis so as to make the laser beam 105 scan the to-be-processed area of the board 111 in the Y-axis direction. The two steerable mirrors 120 and 121 are disposed orthogonally. The positioning control portion 103 controls the rotation angles of the steerable mirrors 120 and 121. When processing in the to-be-processed area using the biaxial scanner 108 is finished, the XY stage 112 sets and positions a next to-be-processed area of the board 111 in the scan area of the biaxial scanner 108.

Figure 13:
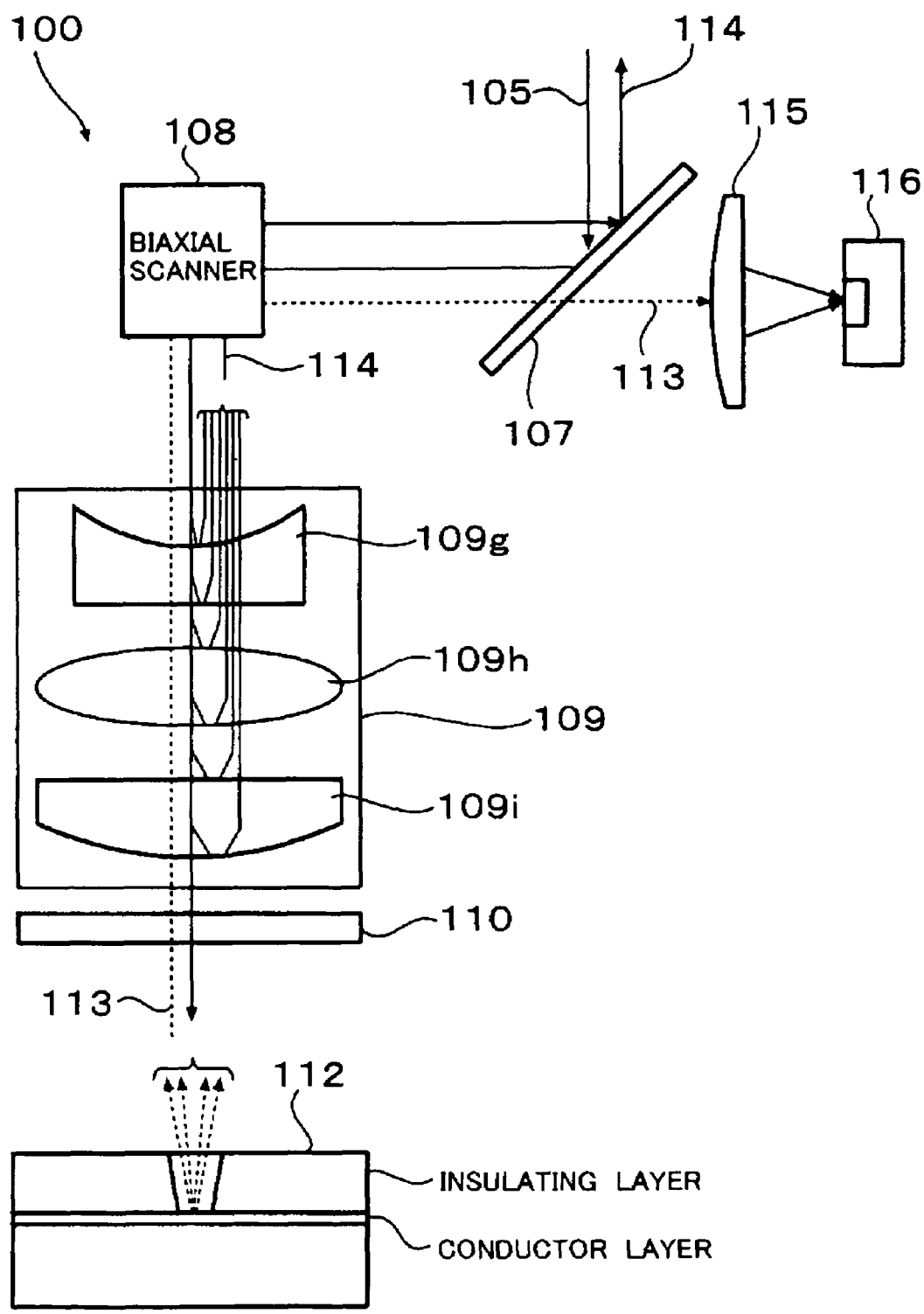
FIG. 13 is a view for explaining a sensing method in the laser processing apparatus according to the second to seventh embodiments.

The operations of the polarizing beam splitter 107 and the quarter wave plate 110 will be described below with reference to the schematic view of FIG. 13. The polarizing beam splitter 107 is characterized by transmitting P-polarized light which is light having an oscillating direction parallel to the paper of FIG. 13, and reflecting S-polarized light which is light having an oscillating direction perpendicular to the paper of FIG. 13. When the laser beam 105 emitted from the laser oscillator 104 is S-polarized, the laser beam 105 is 100% reflected by the polarizing beam splitter 107, and the angle of the laser beam 105 is controlled by the biaxial scanner 108 so that the laser beam 105 is incident on the fθ lens 109. The fθ lens 109 is constituted by a plurality of lenses 109a, 109b, . . . for compensating aberration etc., and the opposite sides of each lens 109a, 109b, . . . are coated with antireflective films.

Antireflective films available presently can prevent reflection to a good extent but cannot prevent reflection perfectly. Usually, it is inevitable to allow reflection of about 0.1% occurring in each surface. When reflection of about 0.1% occurs in each surface of each lens 109a, . . . , reflected light corresponding to the number of lenses 109a, . . . is incident on the polarizing beam splitter 107 as a lens reflected beam 114. The lens reflected beam 114 is not transmitted through the polarizing beam splitter 107 but travels as reflected light toward the laser oscillator 104.

The laser beam 105 transmitted through the fθ lens 109 is used for processing the board 111. In this event, there is a large difference in absorption of the laser beam 105 between each insulating layer and each conductor layer belonging to the board 111 formed into multiple layers. Accordingly, the board reflected beam 113 varies in accordance with the difference in absorption. Generally, the conductor layer is higher in reflection than the insulating layer. Therefore, when the reflected beam 113 can be sensed, monitoring to know which is being processed, the conductor layer or the insulating layer can be performed.

The reflected beam 113 can be sensed easily if the surface roughness of the board 111 is low enough to be regarded as smooth. However, the reflected beam 113 may be reflected irregularly due to some relationship between the surface roughness of each conductor layer of the board 111 and the wavelength of the laser beam 105 applied on the surface. In this case, the light intensity of the reflected beam 113 reflected by the board 111 and returning to the optical sensor 116 becomes so slight that the lens reflected beam 114 reflected by each surface of the fθ lenses is not negligible as noise. The influence of this surface roughness of the board 111 becomes conspicuous when a short-wavelength laser is used.

In order to solve this problem, according to this embodiment, the quarter wave plate 110 is disposed between the board 111 and the fθ lens 109. When the laser beam 105 has penetrated the quarter wave plate 110 (outward), the laser beam 105 transmitted through the quarter wave plate 110 becomes polarized circularly. On the other hand, when the laser beam 105 reflected by the board 111 has penetrated the quarter wave plate 110 again as the board reflected beam 113 (homeward), the polarization direction turns 90 degrees.

The lens reflected beam 114 and the board reflected beam 113 return together through the same optical path and reach the polarizing beam splitter 107. The lens reflected beam 114 is reflected by the polarizing beam splitter 107 because its polarized state remains S-polarized. However, the board reflected beam 113 is transmitted through the polarizing beam splitter 107 because its polarized state is P-polarized due to the turn of 90 degrees. The board reflected beam 113 transmitted thus passes through the condenser lens 115 and is introduced into the optical sensor 116.

According to this embodiment, the laser processing apparatus has the quarter wave plate 110 between the fθ lens 109 and the board 111 so that only the beam reflected by the board 111 can be sensed due to the polarizing characteristic of the quarter wave plate 110. Thus, the processed condition of the board 111 can be determined surely even if the reflected beam from the board 111 is so weak that a sensed signal thereof is faint.

Fourth Embodiment

Figure 8:
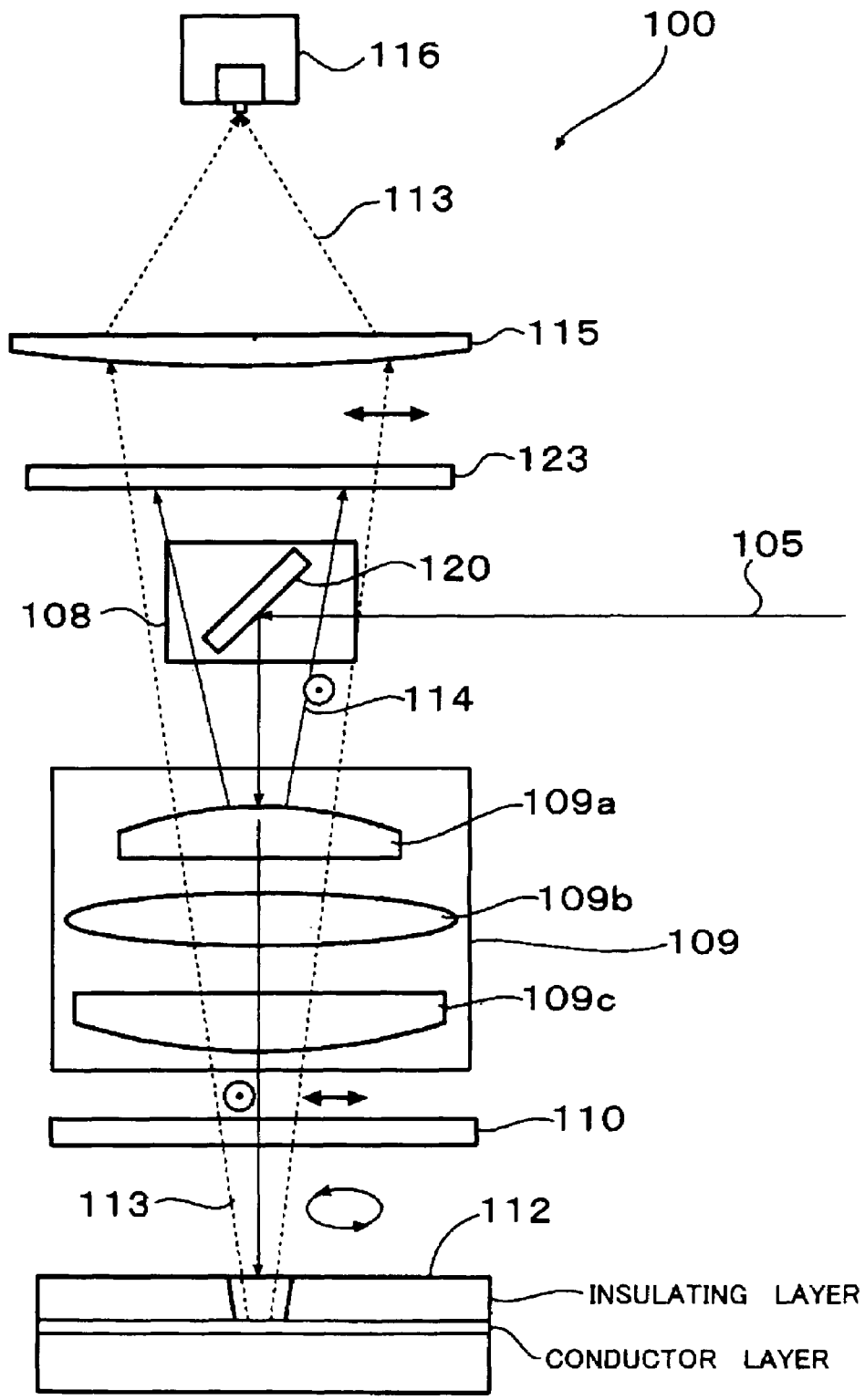
FIG. 8 is a block diagram showing the schematic configuration of a laser processing apparatus according to a fourth embodiment of the invention.

FIG. 8 is a block diagram showing the schematic configuration of a laser processing apparatus 100 according to a fourth embodiment of the invention. FIG. 8 shows only a path portion of a reflected beam. This embodiment is different from the third embodiment in that a polarizing plate 123 is added. Due to the addition of the polarizing plate 123, the layout of an optical system for sensing a reflected beam 113 is different from that in the third embodiment. The angle with which a laser beam 105 is incident on an fθ lens 109 is controlled by a biaxial scanner 108. Thus, a predetermined position of a board 111 is irradiated with the laser beam 105 so that the board 111 is perforated. In that event, the board reflected beam 113 is emitted from the board 111.

Here, when the surface roughness of each conductor layer of the board 111 is remarkably high, the board reflected beam 113 is reflected irregularly with a considerably spread angle. When the spread angle is wide, the irregularly reflected light also leaks from the periphery of steerable mirrors 120 of the biaxial scanner 108. A lens reflected beam 114 reflected by the fθ lens 109 may also have a spread angle due to the shape or layout of lenses 109a, . . . Thus, the lens reflected beam 114 may also leak from the periphery of the steerable mirror 120. When the board reflected beam 113 leaking from the periphery of the steerable mirror 120 makes a round trip via a quarter wave plate 110, the board reflected beam 113 becomes a beam whose polarization direction turns 90° with respect to the lens reflected beam 114. Thus, the lens reflected beam 114 is blocked by the polarizing plate 123 when the polarizing plate 123 is aligned with the direction in which the board reflected beam 113 is transmitted. As a result, only the board reflected beam 113 passes through a condenser lens 115 and is received by an optical sensor 116.

Figure 9:
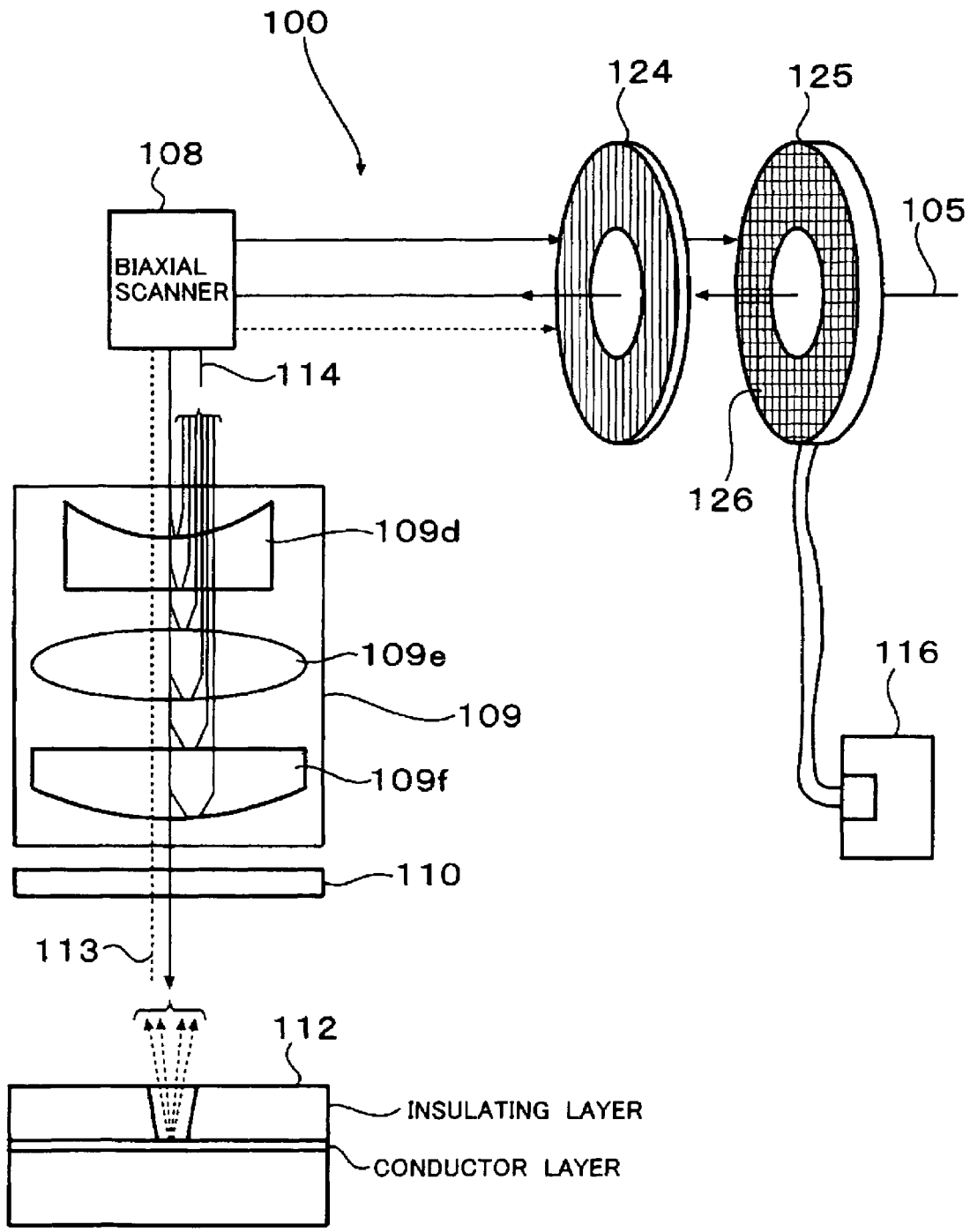
FIG. 9 is a block diagram showing the schematic configuration of a laser processing apparatus according to a fifth embodiment of the invention.

According to this embodiment, the polarizing plate 123 blocks the lens reflected beam 114 so that only the beam reflected by the board 111 can be sensed. Thus, even if the surface roughness of each conductor layer of the board 111 is so high that irregularly reflected light reaches the biaxial scanner portion, the faint board reflected beam 113 can be sensed so that the processed condition of the board 111 can be determined surely Fifth Embodiment FIG. 9 is a block diagram showing the schematic configuration of a laser processing apparatus 100 according to a fifth embodiment of the invention. FIG. 9 shows only a reflected-light sensing portion in the same manner as FIG. 8. In this embodiment, a polarizing plate 124 and an optical fiber array 125 are added to the configuration of the third embodiment shown in FIG. 7, and the condenser lens is omitted therefrom. A sensor 116 is connected to the optical fiber array 125. In accordance with this, the layout of an optical system for sensing a reflected beam 113 is changed.

A laser beam 105 passes through the optical fiber array 125 and the polarizing plate 124 having a hole a little larger than the beam diameter of the laser beam 105, and reaches a biaxial scanner 108. The angle of the laser beam 105 incident on an fθ lens 109 is controlled by the biaxial scanner 108 so that a position to be irradiated with the laser beam 105 is positioned in a predetermined position of a board 111. When the board 111 is processed with the laser beam 105, a board reflected beam 113 is emitted from the board 111. This board reflected beam 113 comes back through the outward path together with a lens reflected beam 114. The board reflected beam 113 and the lens reflected beam 114 become beams thicker than the laser beam 105 due to the influence of irregular reflection or lens curvature. Accordingly, the board reflected beam 113 and the lens reflected beam 114 are partially prevented from passing through the hole of the polarizing plate 124, and incident on the polarizing plate 124 surrounding the hole.

Figure 10:
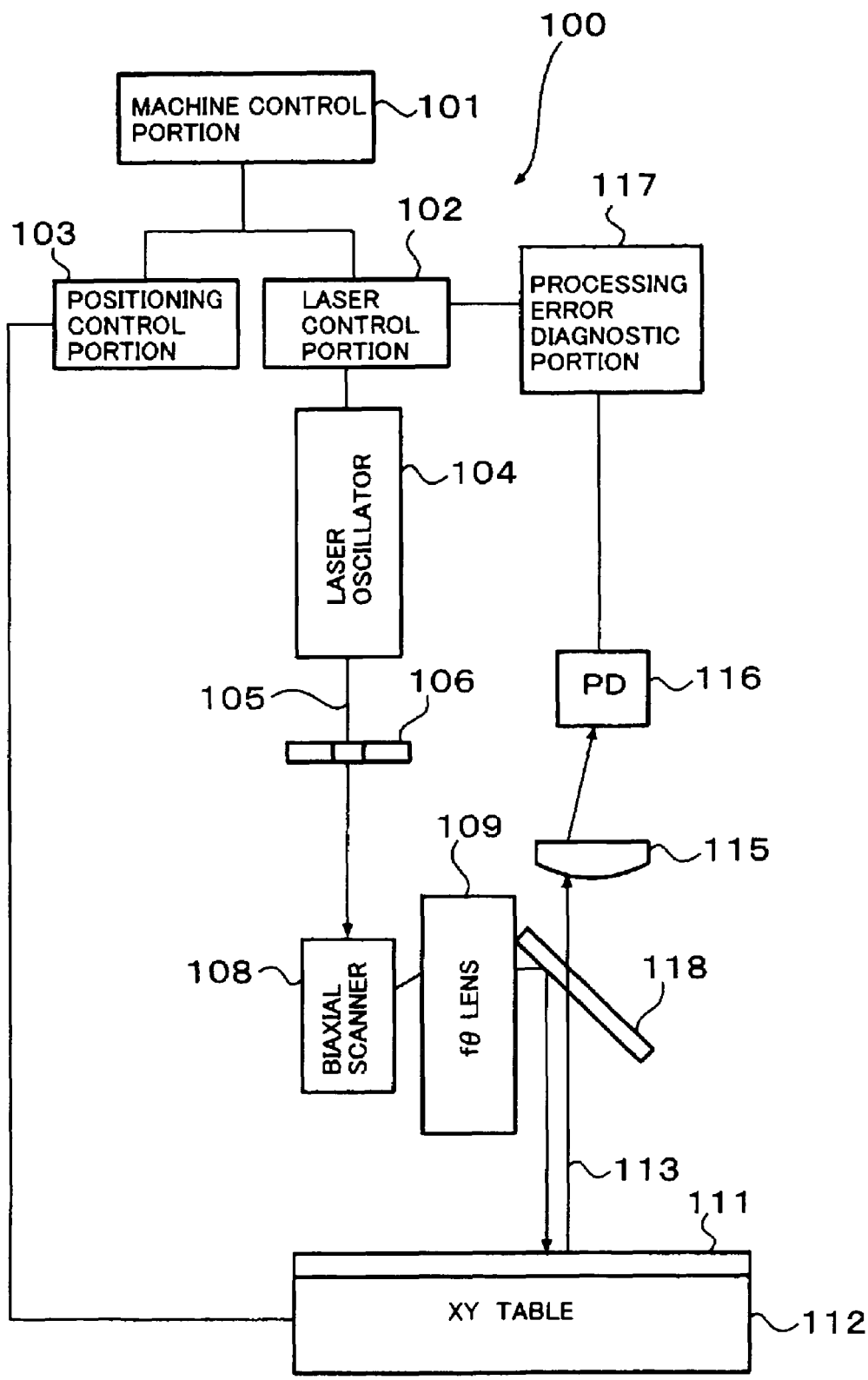
FIG. 10 is a block diagram showing the schematic configuration of a laser processing apparatus according to a sixth embodiment of the invention.

The polarization direction of the board reflected beam 113 having made a round trip via a quarter wave plate turns 90° with respect to the lens reflected beam 114. Thus, the lens reflected beam 114 is blocked by the polarizing plate 124 when the polarizing plate 124 is aligned with the direction in which the board reflected beam 113 is transmitted. As a result, only the board reflected beam 113 passes through the optical fiber array 125 and is received by the optical sensor 116. According to this embodiment, the lens reflected beam 114 is blocked by the polarizing plate 124 and the board reflected beam 113 is introduced into the optical sensor 116 through the optical fiber array 125. Thus, only the beam reflected by the board can be sensed. As a result, even if the sensed signal is faint, the processed condition can be determined surely Sixth Embodiment FIG. 10 is a block diagram showing the schematic configuration of a laser processing apparatus 100 according to a sixth embodiment of the invention. Although a beam splitter is disposed between the laser oscillator and the axial scanner 108 in the third embodiment shown in FIG. 7, a beam splitter 118 is disposed between an fθ lens 109 and a board 111 in this embodiment. The quarter wave plate disposed between the fθ lens 109 and the board 111 is omitted.

A laser beam 105 emitted from a laser oscillator 104 is incident directly on a biaxial scanner 108 via a mask 106. The angle with which the laser beam 105 is incident on the fθ lens 109 disposed next to the biaxial scanner 108 is controlled by this biaxial scanner 108. After that, a major part of the laser beam 105 is reflected 90° by the beam splitter 118 disposed at an angle of 45° with respect to the optical path. A predetermined position of the board 111 is irradiated with the laser beam 105 so that the board 111 is perforated. Here, the ratio of reflection to transmission of the laser beam 105 in the beam splitter 118 is about 99:1.

A part of a board reflected beam 113 generated due to reflection by the board 111 is transmitted through the beam splitter 118, condensed by a focusing lens 115, and then incident on an optical sensor 116. The optical sensor 116 converts the board reflected beam 113 into an electric signal. After that, processing similar to that in the embodiment shown in FIG. 7 is performed. In this embodiment, the laser beam introduced into the optical sensor 116 consists of the board reflected beam 113. Accordingly, the processed condition can be grasped surely even from a faint signal of the board reflected beam 113 without influence of the lens reflected beam in the fθ lens 109.

In this embodiment, the beam splitter 118 is disposed between the fθ lens 109 and the board 111, and the board 111 is processed with the beam reflected by the beam splitter 118. Here, processing is performed not with the transmitted beam but with the reflected beam for the following reason. That is, if the beam condensed by a lens or the like were transmitted by the parallel-plate type beam splitter 118 disposed obliquely at an angle of 45°, astigmatism would occur to cause a problem that the shape of a beam spot near a focal point would be rectangular.

Seventh Embodiment

Figure 11:
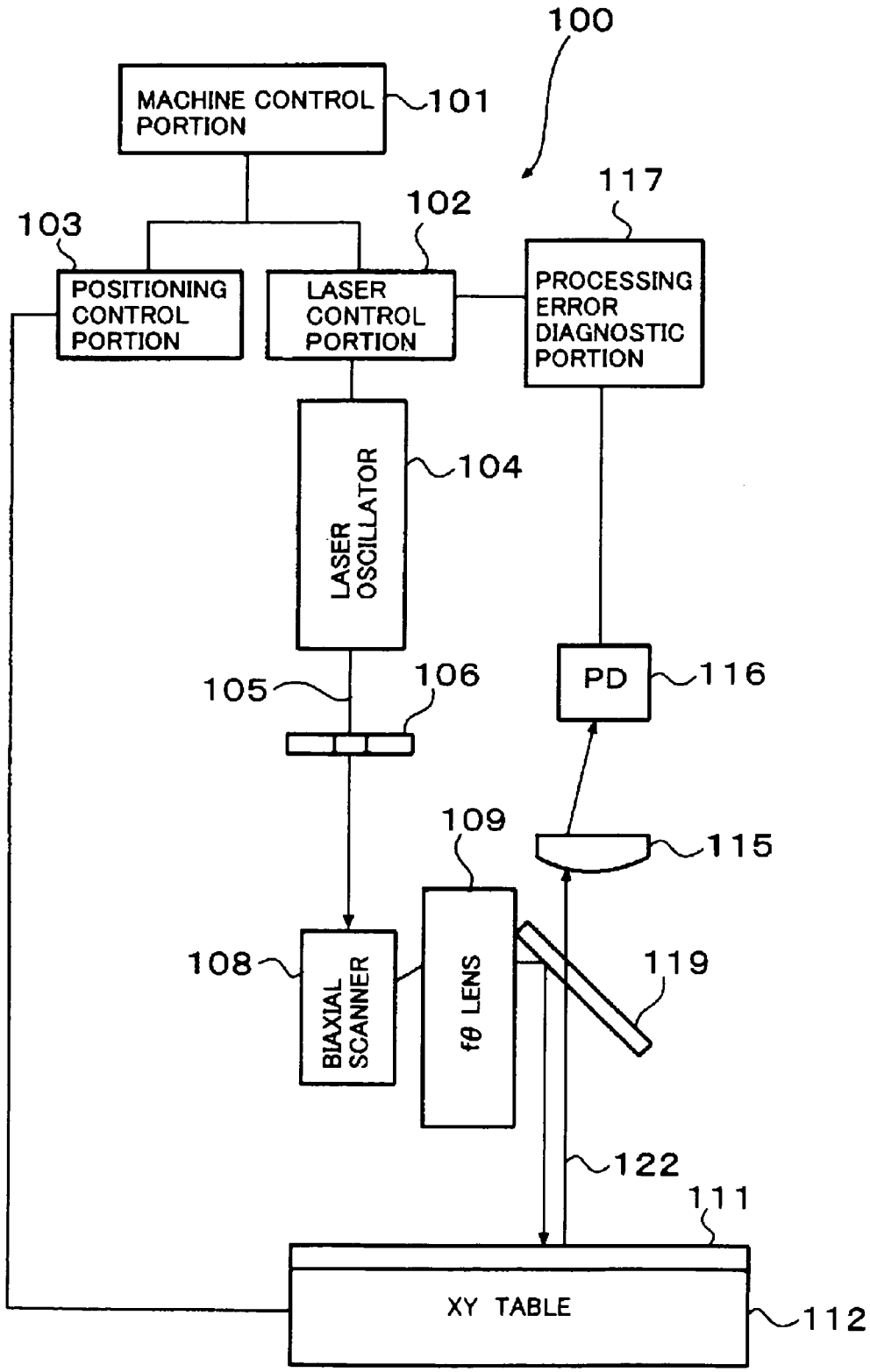
FIG. 11 is a block diagram showing the schematic configuration of a laser processing apparatus according to a seventh embodiment of the invention.

FIG. 11 is a block diagram showing the schematic configuration of a laser processing apparatus 100 according to a seventh embodiment of the invention. This embodiment differs from the sixth embodiment shown in FIG. 10 in that an optics disposed between the fθ lens 109 and the board 111 is different. That is, although the beam splitter 118 is disposed in the six embodiment of FIG. 10, a dichroic mirror 119 is disposed in this embodiment. When the dichroic mirror 119 is used, the processed condition of the board 111 is determined by a light emitting plume 122.

Specifically, the dichroic mirror 119 is disposed at an angle of 45 degrees with respect to the optical path. The laser beam 105 is reflected by the dichroic mirror 119 so that a predetermined position of the board 111 is irradiated with the laser beam 105. Thus, the board 111 is perforated. When the board 111 is processed with the laser beam 105, a light emitting plume 122 peculiar to the material of the board 111 is emitted together with a board reflected beam 113. The dichroic mirror 119 can reflect only specific-wavelength light. A dichroic mirror reflecting only the wavelength of the laser beam 105 is used as the dichroic mirror 119. When the board reflected beam 113 is reflected by the dichroic mirror 119, only the light emitting plume 122 is transmitted through the dichroic mirror 119 and condensed by a condenser lens 115. Subsequent processing is similar to that of each aforementioned embodiment. According to this embodiment, only the board reflected beam 113 is introduced into an optical sensor 116. Since the optical sensor 116 is not affected by the lens reflected beam, it is possible to grasp the processed condition of the board surely.

In this embodiment, the dichroic mirror 119 disposed between the fθ lens 119 and the board 111 is designed to reflect the wavelength of the laser beam 105 to be used. Here, not the transmitted beam but the reflected beam is used for the following reason. If the beam condensed by a lens or the like were transmitted by the parallel-plate type beam splitter 118 disposed obliquely at an angle of 45°, astigmatism would occur. As a result, the shape of a beam spot near a focal point would be rectangular. In addition, even if the wavelength of the light emitting plume 122 is changed when the material of the board 111 is changed, the light emitting plume 122 can be sensed.

What is claimed is:

1. A method for perforating a printed circuit board having conductor layers and insulating layers laminated alternately, the method comprising the steps of:
    irradiating each conductor layer with a pulsed laser beam whose energy density is set at a value enough to process the conductor layer, while monitoring emission from a processed portion;
    obtaining the number of pulses of irradiation required for processing a window in the conductor layer; and
    processing a window in another place of the conductor layer by the obtained number of pulses of irradiation;
    wherein the number of pulses of irradiation required for processing a window in each conductor layer is obtained in each of a plurality of different places, and a maximum value of the obtained numbers of pulses of irradiation is set as the number of pulses of irradiation for the conductor layer.

2. A method for perforating a printed circuit board according to claim 1, wherein the wavelength of the emission to be monitored is set at 500-600 nm.

3. A method for perforating a printed circuit board according to claim 1, wherein each insulating layer is irradiated a plurality of pulses with a pulsed laser beam whose energy density is high enough to remove the insulating layer but low enough not to remove any conductor layer, so that a hole reaching a conductor layer under the insulating layer or reaching the outside is formed in the insulating layer.

4. A method for perforating a printed circuit board according to claim 3, wherein each conductor layer is scanned with a laser beam having a smaller diameter than the diameter of a hole to be processed, so that the hole is processed in the conductor layer.

5. A method for perforating a printed circuit board according to claim 3, wherein the diameter of the laser beam with which the insulating layers are irradiated is made larger than the diameter of the laser beam with which the conductor layers are irradiated.

6. A method for perforating a printed circuit board according to claim 3, wherein the diameter of the laser beam with which the first insulating layer is irradiated is made smaller than the diameter of the laser beam with which the first conductor layer is irradiated.

7. A method for perforating a printed circuit board according to claim 3, wherein the energy densities of the laser beams processing the first to i-th conductor layers are made equal to one another.

8. A method for perforating a printed circuit board according to claim 3, wherein each of the laser beams processing the first to i-th conductor layers tapers a side surface of a processed hole at a taper angle of 10-90°.

9. A method for perforating a printed circuit board according to claim 3, wherein one printed circuit board is processed by:
a test processing step for determining the number of pulses of irradiation for each layer from the first layer to an intended conductor or insulating layer; and
a processing step for irradiating a to-be-processed portion with the pulsed laser beam a number of pulses of irradiation determined by the test processing step, so as to process the to-be-processed portion.

10. A printed circuit board perforating apparatus in which a pulsed laser beam output from a laser oscillator is introduced through an optical system to a printed circuit board having conductor layers and insulating layers laminated alternately, so that a hole is processed in a to-be-processed portion of the printed circuit board, the printed circuit board perforating apparatus comprising:
a sensor for monitoring emission from the processed portion;
a comparison means for comparing an output of the sensor with a predetermined threshold value;
a counter for counting the number of pulses of irradiation with the laser beam with which the processed portion is irradiated till the comparison means operates; and
a storage unit for storing the number of pulses of irradiation counted by the counter;
wherein the numbers of pulses of irradiation stored by test processing are used as the numbers of pulses of irradiation for processing the conductor layers and the insulating layers respectively, and
wherein a database in which setting values of the laser oscillator and respective optical systems are set for each beam mode and each diameter of the laser beam is provided in the storage unit.

11. A printed circuit board perforating apparatus according to claim 10, wherein the sensor is disposed in a position where the sensor can monitor the emission directly.

12. A printed circuit board perforating apparatus according to claim 10, further comprising:
a splitting means and sensors disposed in the optical system on the incoming side of light from the processed portion, the splitting means splitting light with a wavelength of 500-600 nm, the sensors detecting the split light with a wavelength 500-600 nm and light with other wavelengths respectively.

13. A printed circuit board perforating apparatus according to claim 10, wherein the optical system has:
an energy distribution selecting means capable of selecting one of a top-hat distribution in which the energy distribution of the laser beam is substantially uniform in a plane direction perpendicular to an optical axis of the laser beam and a Gaussian distribution in which the energy distribution of the laser beam shows a Gaussian curve in a plane direction perpendicular to the optical axis of the laser beam.

14. A method for perforating a printed circuit board having $\underline{n}$ conductor layers and $\underline{n}$ or $(n-1)$ insulating layers laminated alternately, the first layer from the surface of the printed circuit board is a conductor layer, the method comprising the steps of:
irradiating the first conductor layer a plurality of pulses with a pulsed laser beam whose diameter is equal to a designated hole entrance diameter and whose energy density is high enough to remove the first conductor layer, so as to remove the first conductor layer;
irradiating the first insulating layer under the first conductor layer a plurality of pulses with a pulsed laser beam whose diameter is larger than the diameter of the laser beam processing the first conductor layer and whose energy density is high enough to remove the first insulating layer but low enough not to remove the first conductor layer, so as to remove the first insulating layer;
irradiating the i-th ($\underline{i}$ is an integer from 2 to $\underline{n}$) conductor layer a plurality of pulses with a pulsed laser beam whose diameter is smaller than the diameter of a laser beam processing the (i−1)th conductor layer and whose energy density is high enough to remove the i-th conductor layer, so as to remove the i-th conductor layer; and
irradiating the i-th insulating layer under the i-th conductor layer a plurality of pulses with a pulsed laser beam whose energy density is equal to that of the laser beam processing the first insulating layer, so as to remove the i-th insulating layer;
wherein the diameter of a hole formed in the first conductor layer is kept thus.

15. A method for perforating a printed circuit board according to claim 14, wherein the energy densities of the laser beams processing the first to i-th conductor layers are made equal to one another.

16. A method for perforating a printed circuit board according to claim 14, wherein each of the laser beams processing the first to i-th conductor layers tapers a side surface of a processed hole at a taper angle of 10-90°.

17. A method for perforating a printed circuit board according to claim 14, wherein one printed circuit board is processed by:
a test processing step for determining the number of pulses of irradiation for each layer from the first layer to an intended conductor or insulating layer; and
a processing step for irradiating a to-be-processed portion with the pulsed laser beam a number of pulses of irradiation determined by the test processing step, so as to process the to-be-processed portion.

18. A method for perforating a printed circuit board according to claim 14, wherein each conductor layer is scanned with a laser beam having a smaller diameter than the diameter of a hole to be processed, so that the hole is processed in the conductor layer.

\* \* \* \* \*